(12) United States Patent
Izikson et al.

(10) Patent No.: US 8,175,831 B2
(45) Date of Patent: May 8, 2012

(54) METHODS AND SYSTEMS FOR CREATING OR PERFORMING A DYNAMIC SAMPLING SCHEME FOR A PROCESS DURING WHICH MEASUREMENTS ARE PERFORMED ON WAFERS

(75) Inventors: Pavel Izikson, Haifa (IL); John Robinson, Austin, TX (US); Mike Adel, Zichron Ya'akov (IL); Amir Widmann, Sunnyvale, CA (US); Dongsub Choi, Sungnam (KR); Anat Marchelli, Migdal Haemek (IL)

(73) Assignee: KLA-Tencor Corp., San Jose, CA (US)

( * ) Notice: Subject to any disclaimer, the term of this patent is extended or adjusted under 35 U.S.C. 154(b) by 625 days.

(21) Appl. No.: 12/107,346

(22) Filed: Apr. 22, 2008

(65) Prior Publication Data
US 2008/0286885 A1 Nov. 20, 2008

Related U.S. Application Data

(60) Provisional application No. 60/913,435, filed on Apr. 23, 2007.

(51) Int. Cl.
*G01N 37/00* (2006.01)
(52) U.S. Cl. ....... 702/83; 702/82; 356/237.4; 356/237.5
(58) Field of Classification Search ..................... 702/83
See application file for complete search history.

(56) References Cited

U.S. PATENT DOCUMENTS

| | | | |
|---|---|---|---|
| 4,750,141 A | 6/1988 | Judell et al. | |
| 5,134,303 A | 7/1992 | Blech et al. | |
| 5,248,889 A | 9/1993 | Blech et al. | |
| 5,912,738 A | 6/1999 | Chason et al. | |
| 6,031,611 A | 2/2000 | Rosakis et al. | |
| 6,100,977 A | 8/2000 | Muller | |
| 6,442,496 B1 | 8/2002 | Pasadyn et al. | |
| 6,477,432 B1 | 11/2002 | Chen et al. | |
| 6,766,214 B1 | 7/2004 | Wang et al. | |
| 6,847,458 B2 | 1/2005 | Freischlad et al. | |

(Continued)

FOREIGN PATENT DOCUMENTS

WO WO 2004/061938 7/2004

OTHER PUBLICATIONS

D.K. Bowen et al., "High-Resolution X-Ray Diffractometry and Topography," CRC Press, 1998.

(Continued)

*Primary Examiner* — Jonathan C Teixeira Moffat
(74) *Attorney, Agent, or Firm* — Ann Marie Mewherter

(57) ABSTRACT

Various methods and systems for creating or performing a dynamic sampling scheme for a process during which measurements are performed on wafers are provided. One method for creating a dynamic sampling scheme for a process during which measurements are performed on wafers includes performing the measurements on all of the wafers in at least one lot at all measurement spots on the wafers. The method also includes determining an optimal sampling scheme, an enhanced sampling scheme, a reduced sampling scheme, and thresholds for the dynamic sampling scheme for the process based on results of the measurements. The thresholds correspond to values of the measurements at which the optimal sampling scheme, the enhanced sampling scheme, and the reduced sampling scheme are to be used for the process.

30 Claims, 3 Drawing Sheets

U.S. PATENT DOCUMENTS

| | | | |
|---|---|---|---|
| 6,859,746 B1* | 2/2005 | Stirton | 702/83 |
| 7,398,172 B2* | 7/2008 | Behm et al. | 702/83 |
| 2004/0121495 A1 | 6/2004 | Sonderman et al. | |
| 2006/0195215 A1* | 8/2006 | Suzuki et al. | 700/109 |
| 2006/0273266 A1* | 12/2006 | Preil et al. | 250/548 |

OTHER PUBLICATIONS

G. Turrell et al. "Raman Microscopy," Academic Press, 1996, pp. 27-277.

G.G. Stoney, "The Tension of Metallic Films Deposited by Electrolysis" (1909), Proc. Roy. Soc., p. 172.

Kuo et al. "Adaptive Sampling for Effective Mult-layer Defect Monitoring," Semiconductor Mfg. Conf. Proc., 1997 IEEE Int'l Symposium, pp. D-01.

Partial International Search Report for PCT/US2008/061299 mailed on Jul. 24, 2008.

Zhang et al., "Across Wafer Focus Mapping and Its Applications in Advanced Technology Nodes," Proc. Of SPIE, vol. 6154, Feb. 2006, pp. 61540N-1-61540N-10.

International Search Report and Written Opinion for PCT/US2008/061299 mailed on Oct. 10, 2008.

* cited by examiner

US 8,175,831 B2

METHODS AND SYSTEMS FOR CREATING OR PERFORMING A DYNAMIC SAMPLING SCHEME FOR A PROCESS DURING WHICH MEASUREMENTS ARE PERFORMED ON WAFERS

PRIORITY CLAIM

This application claims priority to U.S. Provisional Application No. 60/913,435, filed on Apr. 23, 2007, entitled "Methods and Systems for Creating or Performing a Dynamic Sampling Scheme for a Process During Which Measurements are Performed on Wafers," which is incorporated herein by reference in its entirety.

BACKGROUND OF THE INVENTION

1. Field of the Invention

The present invention generally relates to methods and systems for creating or performing a dynamic sampling scheme for a process during which measurements are performed on wafers. Certain embodiments relate to performing measurements on all wafers in at least one lot at all measurement spots on the wafers and determining parameters for a dynamic sampling scheme for the process based on results of the measurements.

2. Description of the Related Art

The following description and examples are not admitted to be prior art by virtue of their inclusion in this section.

Fabricating semiconductor devices such as logic and memory devices typically includes processing a specimen such as a semiconductor wafer using a number of semiconductor fabrication processes to form various features and multiple levels of the semiconductor devices. For example, lithography is a semiconductor fabrication process that typically involves transferring a pattern to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a semiconductor wafer and then separated into individual semiconductor devices.

Metrology processes are used at various steps during a semiconductor manufacturing process to monitor and control the process. For example, metrology processes are used to measure one or more characteristics of a wafer such as a dimension (e.g., line width, thickness, etc.) of features formed on the wafer during a process such that the performance of the process can be determined from the one or more characteristics. In addition, if the one or more characteristics of the wafer are unacceptable (e.g., out of a predetermined range for the characteristic(s)), the measurements of the one or more characteristics of the wafer may be used to alter one or more parameters of the process such that additional wafers manufactured by the process have acceptable characteristic(s).

Metrology has also been used to measure stress in films deposited on semiconductor wafers. Efforts to increase die yield have been focused on minimizing the overall stress in wafers by maintaining the stress at each process step below a control limit. Various methods involving global stress measurements have been developed to monitor the overall stress. One method includes measuring the shape of the wafer before a process step and then repeating the shape measurement after the process step. If the stress and film thickness are reasonably uniform across the wafer and if the change in the shape of the wafer is not large compared with the thickness of the wafer, then Stoney's equation may be used to calculate the film stress.

There are a number of disadvantages to using metrology processes and tools to measure one or more characteristics of a wafer for process monitoring and control applications. For example, most metrology tools are relatively slow, particularly compared to inspection systems. Therefore, metrology processes are often performed at one location or a limited number of locations on the wafer such that metrology results may be acquired in a relatively expedient manner. As such, in order to provide sufficient metrology results without significantly reducing the throughput of the fabrication process, the wafers that are measured and the measurements performed on the wafers should be carefully selected. The wafers that are measured and the number of measurements performed per wafer are commonly referred to as the "sampling" of the metrology process.

In standard metrology processes, the sampling may be selected once per layer or even once per fabrication facility (or "fab") and are not changed at all. As such, these processes are disadvantageous due to the insensitivity of the sampling to fabrication process variations and changes. In particular, the same sampling rate is used for a fabrication process with low variations and a fabrication process with high variations. Therefore, some methods and systems have been developed to increase the sensitivity of the sampling of the metrology process to the variations in the fabrication process.

Examples of methods and systems for varying the sampling of a metrology process are illustrated in U.S. Pat. No. 6,442,496 to Pasadyn et al., U.S. Patent Application Publication No. 2004/0121495 by Sonderman et al., and International Publication No. WO 2004/061938 by Sonderman et al., which are incorporated by reference as if fully set forth herein. In the methods and systems described in these publications, dynamic sampling is performed when a decision to change the sampling rate is taken if the current outcome of a metrology process is different from the outcome predicted by some model. In particular, these methods and systems determine the amount of deviation between measurements on manufactured semiconductor wafers as compared to the expected results determined by a manufacturing model. If the amount of deviation is high, the methods and systems assume that the accuracy of the manufacturing process is low, and the sampling rate is increased to acquire production data that more accurately reflects the actual results of the manufacturing process. The sampling rate is changed in this manner assuming that acquiring more production data increases the accuracy of the production data and that when the accuracy of the production data is more reflective of the actual manufacturing process results, calculations of the model errors that are used to modify control input parameters to the manufacturing tool become more precise.

The methods and systems described in these publications are, however, disadvantageous due to the use of the model. In particular, the decisions to alter the sampling rate are based upon differences between output of a model and measurement results on manufactured wafers. Therefore, if there are errors in the model, these errors will lead to oversampling or undersampling of the manufactured wafers. Oversampling and undersampling are both disadvantageous. In particular, unnecessary oversampling of the manufactured wafers can lead to lower throughput of the manufacturing process while undersampling of the wafers can result in substantially inaccurate process monitoring and control and reduced yield of the manufacturing processes.

Accordingly, it would be advantageous to develop methods and systems for creating and/or performing a dynamic sampling scheme for a process during which measurements are performed on wafers, which can be used to increase (or at least maintain) throughput of fabrication processes performed on the wafers and to increase accuracy of process monitoring and control and yield of the fabrication processes.

SUMMARY OF THE INVENTION

The following description of various embodiments of methods and systems is not to be construed in any way as limiting the subject matter of the appended claims.

Methods for creating a dynamic sampling scheme for a process during which measurements are performed on wafers are provided. One embodiment of such a method includes performing the measurements on all of the wafers in at least one lot at all measurement spots on the wafers. The method also includes determining an optimal sampling scheme, an enhanced sampling scheme, a reduced sampling scheme, and thresholds for the dynamic sampling scheme for the process based on results of the measurements. The thresholds correspond to values of the measurements at which the optimal sampling scheme, the enhanced sampling scheme, and the reduced sampling scheme are to be used for the process.

In one embodiment, all of the measurement spots include all fields on the wafers, all targets on the wafers, or all fields and all targets on the wafers. In another embodiment, the method includes performing the method at predetermined intervals. In an additional embodiment, the results of the measurements include information about variation in the measurements. In a further embodiment, the optimal sampling scheme, the enhanced sampling scheme, and the reduced sampling scheme are determined based on the results of the measurements in combination with information from one or more tools that performed one or more other processes on the wafers.

In one embodiment, the optimal sampling scheme, the enhanced sampling scheme, and the reduced sampling scheme include numbers of other wafers in other lots to be measured in the process. In another embodiment, the optimal sampling scheme, the enhanced sampling scheme, and the reduced sampling scheme include numbers of other wafers in other lots to be measured in the process and one or more parameters of the measurements to be performed on each of the other wafers during the process.

In one embodiment, the method includes performing the dynamic sampling scheme by performing the measurements on other wafers in other lots during the process, comparing values of the measurements performed on the other wafers to the thresholds, and determining which of the sampling schemes is to be used for the process during which the measurements are performed on additional wafers in additional lots based on results of the comparing step. In one such embodiment, the method includes altering one or more parameters of a tool configured to perform the process prior to performing the measurements on the additional wafers. In another embodiment, the process includes a metrology process.

Another embodiment relates to a method for dynamically selecting a sampling scheme for a process during which measurements are performed on wafers. The method includes performing the measurements on at least one wafer in at least one lot using an optimal sampling scheme. The method also includes comparing values of the measurements to thresholds that correspond to the values of the measurements at which an enhanced sampling scheme or a reduced sampling scheme is to be used for the process instead of the optimal sampling scheme. In addition, the method includes selecting the optimal sampling scheme, the enhanced sampling scheme, or the reduced sampling scheme for the process during which the measurements are to be performed on at least one additional wafer in at least one additional lot based on results of the comparing step.

In one embodiment, the method includes altering one or more parameters of a tool configured to perform the process prior to performing the measurements on the at least one additional wafer.

An additional embodiment relates to a system configured to create a dynamic sampling scheme for a process during which measurements are performed on wafers. The system includes a measurement tool configured to perform the measurements on the wafers. The system also includes one or more processors configured to control the measurement tool to perform the measurements on all of the wafers in at least one lot at all measurement spots on the wafers. The one or more processors are also configured to determine an optimal sampling scheme, an enhanced sampling scheme, a reduced sampling scheme, and thresholds for the dynamic sampling scheme for the process based on results of the measurements. The thresholds correspond to values of the measurements at which the optimal sampling scheme, the enhanced sampling scheme, and the reduced sampling scheme are to be used for the process.

In one embodiment, all of the measurement spots include all fields on the wafers, all targets on the wafers, or all fields and all targets on the wafers. In another embodiment, the system is configured to create the dynamic sampling scheme at predetermined intervals. In an additional embodiment, the results of the measurements include information about variation in the measurements. In a further embodiment, the one or more processors are configured to determine the optimal sampling scheme, the enhanced sampling scheme, and the reduced sampling scheme based on the results of the measurements in combination with information from one or more tools that performed one or more other processes on the wafers.

In one embodiment, the optimal sampling scheme, the enhanced sampling scheme, and the reduced sampling scheme include numbers of other wafers in other lots to be measured in the process. In another embodiment, the optimal sampling scheme, the enhanced sampling scheme, and the reduced sampling scheme include numbers of other wafers in other lots to be measured in the process and one or more parameters of the measurements to be performed on each of the other wafers during the process.

In one embodiment, the one or more processors are configured to perform the dynamic sampling scheme by comparing values of the measurements performed on other wafers in other lots to the thresholds and determining which of the sampling schemes is to be used for the process during which the measurements are performed on additional wafers in additional lots based on results of the comparing step. In one such embodiment, the one or more processors are configured to alter one or more parameters of the measurement tool before the measurement tool performs the process on the additional wafers. In another embodiment, the measurement tool is configured as a metrology tool. Each of the embodiments of the system described above may be further configured as described herein.

A further embodiment relates to a method for sampling wafers during a measurement process. The method includes designing a plurality of sampling schemes for the measurement process. The method also includes triggering one of the plurality of sampling schemes for the wafers. In addition, the method includes activating the triggered sampling scheme such that measurements are performed on the wafers during the measurement process using the triggered sampling scheme.

In one embodiment, designing the plurality of sampling schemes includes performing measurements on all wafers in at least one lot at all measurement spots on all of the wafers. In one such embodiment, the designing step includes determining, based on the measurements performed on all of the wafers, an optimal sampling scheme, an enhanced sampling scheme, and a reduced sampling scheme. In addition, such an embodiment includes determining thresholds, based on the results of the measurements, that will be used to trigger the optimal sampling scheme, the enhanced sampling scheme, and the reduced sampling scheme.

In one embodiment, designing the plurality of sampling schemes includes designing the plurality of sampling schemes based on results of measurements performed on all wafers in at least one lot at all measurement spots on all of the wafers. In one such embodiment, the wafers for which the triggered sampling scheme is activated are in a lot other than the at least one lot. In another such embodiment, the results of the measurements include raw measurement data, and the method includes applying an absolute value or regression filter to the raw measurement data before designing the plurality of sampling schemes based on the raw measurement data.

In some embodiments, designing the plurality of sampling schemes includes designing the plurality of sampling schemes based on results of measurements performed on all wafers in at least one lot at all measurement spots on all of the wafers and based on information from one or more tools that performed one or more processes on all of the wafers. In another embodiment, designing the plurality of sampling schemes includes designing the plurality of sampling schemes based on results of measurements performed on all wafers in at least one lot at all measurement spots on all of the wafers and based on historical process control data for one or more processes performed on all of the wafers. In an additional embodiment, designing the plurality of sampling schemes includes designing the plurality of sampling schemes based on an optimization criterion and one or more constraints external to the measurement process.

In one embodiment, designing the plurality of sampling schemes includes determining direct thresholds to be used for the triggering step. In another embodiment, the triggering step is initiated by comparing results of measurements performed on all wafers in at least one lot at all measurement spots on all of the wafers to direct thresholds. In an additional embodiment, the triggering step is initiated by comparing statistical properties of results of measurements performed on all wafers in at least one lot at all measurement spots on all of the wafers to direct thresholds. In a further embodiment, the triggering step is initiated by comparing historical process control data to direct thresholds. In some embodiments, the triggering step is initiated by comparing data from one or more metrology tools or one or more process tools to direct thresholds.

In one embodiment, designing the plurality of sampling schemes includes determining non-direct thresholds to be used for the triggering step. In another embodiment, the triggering step is initiated by comparing time data to non-direct thresholds. In an additional embodiment, the triggering step is initiated by comparing process tool quality control data to non-direct thresholds. In a further embodiment, the triggering step is initiated by comparing production floor or material planning data to non-direct thresholds.

It has been found that some materials and processes can cause highly non-uniform stress in a wafer. For these materials and processes, the methods for monitoring global stress described above are not adequate for accurately determining the non-uniform stress. The lack of accurate accounting of non-uniform stress can lead to low die yields in some regions of the wafer where the alignment of one pattern with earlier patterns is poor. Accordingly, there is a need for methods and systems that account for non-uniform stress on the wafers.

Embodiments are provided that use high-order stress or topography metrology results for wafers to make corrections to a patterning process that is used to print a design pattern on the wafers, thereby increasing yield for such processes. The embodiments described herein can be used to measure wafer stress and/or topography at critical process steps with more detail (spatial resolution) than in current practice. The measurements can be input to a model to determine how deformation of the wafers will affect the patterning step. The model also determines high-order corrections to the process, which can be provided in a feed forward loop to an exposure or patterning system so that the exposure or patterning system can make real-time adjustments before or during the patterning step.

The embodiments described herein are different from the methods and systems described above because exposure systems have relatively severe constraints on the time available to perform metrology on wafers in preparation for the patterning step. Due to these time constraints, in-situ metrology processes do not currently include relatively high density sampling for stress and deformation metrology that enables high-order focus and overlay corrections during the subsequent patterning step. The embodiments described herein provide a number of advantages. For example, lithography exposure systems (e.g., scanners) can be substantially expensive. A 193 nm immersion scanner can cost around $30 million. Since the embodiments described herein can be used to improve the efficiency of exposure systems, the embodiments described herein may be of relatively high value to users of exposure systems.

One embodiment relates to a method for patterning a wafer. The method includes performing measurements on the wafer. The method also includes modeling deformation of the wafer based on results of the measurements. In addition, the method includes altering one or more parameters of a patterning tool based on the deformation of the wafer. The method further includes after the altering step, patterning the wafer using the patterning tool to produce a first pattern wafer.

In one embodiment, performing the measurements includes performing the measurements at all measurement spots on the wafer. In another embodiment, the results of the measurements include stress metrology data. In an additional embodiment, the results of the measurements include shape metrology data. In a further embodiment, the results of the measurements include overlay metrology data.

In one embodiment, modeling the deformation of the wafer includes estimating the deformation the wafer will have when the wafer is placed on a stage of the patterning tool. In another embodiment, modeling the deformation includes simulating effects of the deformation on the patterning of a design pattern on the wafer.

In one embodiment, the method includes performing additional measurements on the first patterned wafer, altering the one or more parameters of the patterning tool based on results of the additional measurements, and after altering the one or more parameters of the patterning tool based on the results of the additional measurements, patterning a second wafer using the patterning tool to produce a second patterned wafer. In one such embodiment, the results of the additional measurements include overlay metrology data. In another such embodiment, the results of the additional measurements include focus metrology data. In an additional such embodiment, the results of the additional measurements include dose metrology data.

In one embodiment, the first and second patterned wafers are in the same lot. In another embodiment, the first and second patterned wafers are in different lots.

Another embodiment relates to a system operable to pattern a wafer. The system includes a measurement tool operable to perform measurements on the wafer. The system also includes one or more processors operable to model deformation of the wafer based on results of the measurements. The one or more processors are also operable to alter one or more parameters of a patterning process based on the deformation of the wafer. In addition, the system includes a patterning tool operable to pattern the wafer using the patterning process after the one or more parameters of the patterning process have been altered to produce a first patterned wafer. The embodiment of the system described above may be further configured as described herein.

Each of the steps of each of the method embodiments described above may be performed as described further herein. In addition, each of the embodiments of the methods described above may include any other step(s) of any other method(s) described herein. Furthermore, each of the embodiments of the methods described above may be performed by any of the systems described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
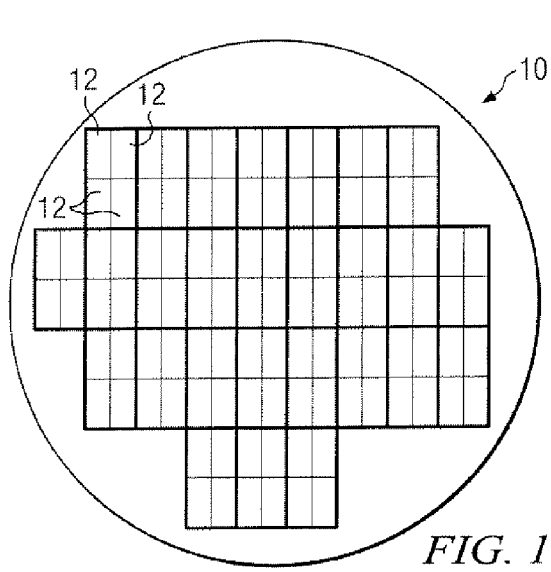
FIG. 1 is a schematic diagram illustrating a top view of one example of a wafer and fields formed thereon.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "wafer" generally refers to a substrate formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include one or more layers formed upon a substrate. For example, such layers may include, but are not limited to, a resist, a dielectric material, a conductive material, and a semiconductive material. Many different types of such layers are known in the art, and the term wafer as used herein is intended to encompass a wafer including all types of such layers.

One or more layers formed on a wafer may be patterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art is being fabricated.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

One embodiment relates to a method for creating a dynamic sampling scheme for a process during which measurements are performed on wafers. In one embodiment, the process includes a metrology process. In this manner, the method may include creating a dynamic sampling scheme for a metrology process. The metrology process may include any of the measurements described further herein. The metrology process may also include one or more different measurements. In addition, the metrology process may include any other suitable metrology process known in the art. Furthermore, the metrology process may vary depending on the fabrication process that is performed on the wafers prior to the metrology process. For example, different metrology processes may be appropriate for measuring different characteristics suitable for monitoring and controlling different fabrication processes. In this manner, prior to performing the method for creating a dynamic sampling scheme, the wafers may be processed using a fabrication process. The fabrication process that is performed on the wafers may include any fabrication process known in the art. As such, the methods described herein can be used to create a dynamic sampling scheme for any metrology process that is used to monitor and control any fabrication process.

A dynamic sampling scheme for a metrology process may include each of the following parameters or some combination thereof: frequency of sample lots; number of wafers; numeric designation of wafers; number of fields; locations of the fields on the wafer; number of sites in each field; locations of the sites in the field; type of metrology target; or measurement algorithms. A method of sampling wafers in accordance with a dynamic sampling scheme may include the steps of designing a plurality of sampling schemes, triggering a sampling scheme, and activating the triggered sampling scheme. Each of these steps may be performed as described further herein.

The method includes performing the measurements on all of the wafers in at least one lot at all measurement spots on the wafers. This step is referred to herein as "omniscient sampling." A "lot" of wafers is generally defined herein as a plurality of wafers that are processed as a group, collectively or one after the other, in fabrication processes. In one embodiment, all of the measurement spots include all fields on the wafers. For example, as shown in FIG. 1, wafer 10 has fields 12 formed thereon. Although a particular number and arrangement of fields 12 on wafer 10 are shown in FIG. 1, the number and arrangement of fields on the wafer may vary depending on, for example, the device being formed on the wafers. The measurements may be performed at all of fields 12 formed on wafer 10 and at all of the fields on other wafers in at least one lot. For example, the measurements may be performed at least once per field formed on all of the wafers in at least one lot. The measurements may be performed on device structures formed in the fields and/or on test structures formed in the fields. In addition, the measurements performed in each of the fields may include all of the measurements performed during the metrology process (e.g., one or more different measurements).

Figure 2:
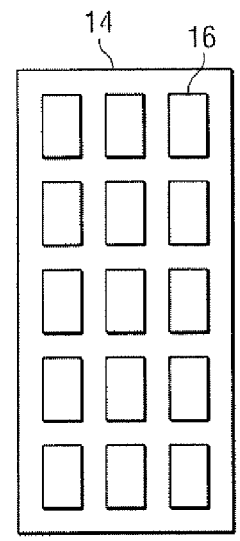
FIG. 2 is a schematic diagram illustrating a top view of one example of a field on a wafer and targets formed therein.

In another embodiment, all of the measurement spots include all targets on the wafers in at least one lot. For example, as shown in FIG. 2, field 14 formed on a wafer (not shown in FIG. 2) may include targets 16. Although a particular number and arrangement of targets 16 in field 14 are shown in FIG. 2, the number and arrangement of targets in the fields may vary depending on, for example, the device being formed on the wafer. Targets 16 may include device structures and/or test structures. In this embodiment, therefore, the measurements may be performed on all of targets 16 formed in field 14. In addition, the measurements may be performed at least once per target formed in field 14. The measurements may also include all of the measurements that are performed during the metrology process (e.g., one or more different measurements).

In an additional embodiment, all of the measurement spots include all fields and all targets on the wafers in at least one lot. For example, each of fields 12 shown formed on wafer 10 in FIG. 1 may include one or more targets such as targets 16 shown in FIG. 2. Therefore, the measurements may be performed on each of the targets in each of the fields formed on each of the wafers in at least one lot.

In one embodiment, the results of the measurements performed in the omniscient sampling step include information about variation in the measurements. The variation in the measurements may be determined in any manner known in the art (e.g., standard deviation, amount of variation, etc.). Since the variation in the measurements will generally indicate variations in the process or process excursions, the number of lots of wafers that are measured in the omniscient sampling step may vary depending on the process or the process excursions. As such, although at least one lot is measured in the omniscient sampling step, the number of lots that are measured may be 3 lots, 4 lots, 5 lots, etc. depending on the results of the measurements for each sampled lot. In this manner, the method is started with omniscient sampling of a number of lots in which all wafers and all fields and/or all targets on the wafers are measured, and sources of variation are learned. The sources of variation that are identified or determined in this step may include any sources of variation including, but not limited to, overlay variation, critical dimension (CD) variation, variation in other characteristics of the wafers, lot-to-lot variation, wafer-to-wafer variation, field-to-field variation, side-to-side variation, statistical sources of variation, and the like, or any combination thereof.

The method also includes determining an optimal sampling scheme, an enhanced sampling scheme, a reduced sampling scheme, and thresholds for the dynamic sampling scheme for the process based on results of the measurements. In general, the enhanced sampling scheme is for higher sampling than the optimal sampling scheme, and the reduced sampling scheme is for lower sampling than the optimal sampling scheme. In other words, the enhanced sampling scheme has a higher sampling rate than the optimal sampling scheme, while the reduced sampling scheme has a lower sampling rate than the optimal sampling scheme. In this manner, the optimal sampling scheme may be determined, and then the enhanced sampling scheme and the reduced sampling scheme can be determined from the optimal sampling scheme. For example, if the results of the measurements indicate that the fabrication process exhibits significant side-to-side variation in CD but not significant wafer-to-wafer variation in CD, the optimal sampling scheme may include a significant number of measurements of CD on both sides of just a few wafers in a lot. In contrast, if the results of the measurements indicate that the fabrication process exhibits significant wafer-to-wafer variation in overlay but not significant side-to-side variation in overlay, the optimal sampling scheme may include measurements of a significant number of wafers, but only a few measurements across each wafer. In both of the above examples, the enhanced sampling scheme and the reduced sampling scheme can be determined based on the optimal sampling scheme.

Figure 3:
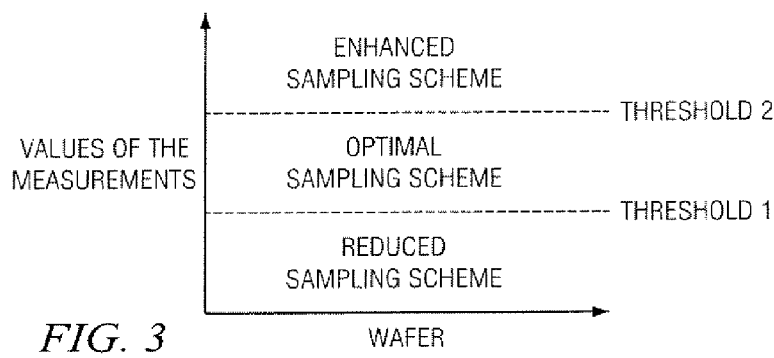
FIG. 3 is a schematic diagram illustrating one embodiment of a dynamic sampling scheme created by embodiments described herein.

The thresholds correspond to values of the measurements at which the optimal sampling scheme, the enhanced sampling scheme, and the reduced sampling scheme are to be used for the metrology process. For example, as show in FIG. 3, the thresholds may include Threshold 1 and Threshold 2. Threshold 1 corresponds to values of the measurements below which the reduced sampling scheme is to be used for the metrology process. Threshold 2 corresponds to values of the measurements above which the enhanced sampling scheme is to be used for the metrology process. As shown in FIG. 3, the values of the measurements between Thresholds 1 and 2 correspond to values of the measurements for which the optimal sampling scheme is to be used for the metrology process.

The values of the measurements that the thresholds correspond to and that are compared to the thresholds may include variation in the measurements. The variation in the measurements may be determined in any manner known in the art (e.g., standard deviation, amount of variation, etc.). For example, the values of the thresholds may correspond to different values of variations in CD, overlay, or any other measurable characteristic of the wafers, one value above which the enhanced sampling scheme is used instead of the optimal sampling scheme and another value below which the reduced sampling scheme is used instead of the optimal sampling scheme. In one such example, one threshold may correspond to a predetermined percentage of variation above which enhanced sampling is to be used. In this manner, if measurements performed on a lot of wafers using the optimal sampling scheme exhibit more than a predetermined percentage of variation (e.g., 10% variation, 20% variation, etc.) across the lot, the enhanced sampling scheme may be selected for the measurement process performed on additional lots of wafers. However, the values of the measurements that the thresholds correspond to and that are compared to the thresholds may include the values of the measurements themselves.

For example, the values of the thresholds may correspond to different values of CD, overlay, or any other measurable characteristic of the wafers, one value above which the enhanced sampling scheme is used instead of the optimal sampling scheme and another value below which the reduced sampling scheme is used instead of the optimal sampling scheme.

Since the values of or variation in the measurements will generally indicate variations in the process or process excursions, the dynamic sampling scheme may adjust the sampling scheme based on how the fabrication process is "behaving." In particular, for processes with high variations, a high sample rate or the enhanced sampling scheme is selected. In this manner, for processes with high variations, more wafers per lot, more measurements per wafer, etc. can be performed by selecting the enhanced sampling scheme. In contrast, for processes with low variations, the low sample rate or the reduced sampling scheme is selected. As such, for processes with low variations, fewer wafers per lot, fewer measurements per wafer, etc. can be performed by selecting the reduced sampling scheme. In this manner, the embodiments described herein are advantageous since the embodiments can be used to provide increased information about processes that are exhibiting poor performance (e.g., high variations), which can be used for more accurate process control and monitoring thereby increasing yield, and less information about processes that are exhibiting excellent performance (e.g., low variations), which decreases the number of measurements that are performed for these processes thereby increasing throughput.

The embodiments described herein are, therefore, advantageous over other methods and systems for sampling in that the dynamic sampling schemes created as described herein are more sensitive to the fabrication process variations or excursions. In particular, if process excursions occur, the sampling scheme (or the sample rate) is adjusted. In addition, as described above, the dynamic sampling scheme is created based on results of the measurements performed in the omniscient sampling step. Therefore, the embodiments described herein are also advantageous over currently used methods and systems for dynamic sampling that use a model since the omniscient sampling described herein provides more decision criteria for creating the dynamic sampling scheme than the previously used models.

As described above, the different sampling schemes and the thresholds may be determined from the results of the omniscient sampling. However, information from processing (i.e., fabrication) tools may be added to the results of omniscient sampling and used to select the optimal, enhanced, and reduced sampling schemes in addition to the thresholds. For example, in one embodiment, the optimal sampling scheme, the enhanced sampling scheme, and the reduced sampling scheme are determined based on the results of the measurements in combination with information from one or more tools that performed one or more other processes on the wafers. The one or more tools may include any fabrication tools known in the art (e.g., lithography tools, etch tools, deposition tools, ion implantation tools, chemical-mechanical polishing (CMP) tools, etc.). The information from the one or more fabrication tools may include some quality metric of the fabrication tool(s) or any other information that is generated by or can be acquired from the fabrication tool(s). Therefore, the information from the one or more tools may include the fabrication process history of the wafers measured during the omniscient sampling step. The information from the one or more tools may be acquired in any manner known in the art. For example, the information may be acquired directly from a processor or storage medium coupled to the one or more tools. Alternatively, the information may be acquired indirectly from the one or more tools. For example, the one or more tools may send the information to a database such as a fab database, and the information may be acquired from such a database or any other suitable storage medium. The information from the one or more tools may have any suitable format known in the art.

Using information from one or more tools that performed one or more fabrication processes on the wafers in combination with results of the measurements performed by omniscient sampling to create the dynamic sampling scheme may be advantageous for a number of reasons. For example, the information from the one or more tools may be used to determine if the process(es) that were used to fabricate the wafers were operating within the process window(s) for the process (es) and/or where within the process window(s) the process (es) were operating. In this manner, the information from the one or more tools may be used to determine if the results of the measurements performed by omniscient sampling are indicative of results that can be expected for a process that is exhibiting nominal process variations, lower than nominal process variations, or higher than nominal process variations. Therefore, the information can be used to determine if the results of the measurements performed by omniscient sampling correspond to an optimal sampling scheme (nominal or "standard" process variations), a reduced sampling scheme (lower than nominal process variations), or an enhanced sampling scheme (higher than nominal process variations) and to set the thresholds appropriately.

The wafers that are measured during omniscient sampling may also include wafers that were processed by the fabrication tool(s) at intentionally different parameters of the fabrication tool(s). Therefore, the variations in the results of the measurements performed during omniscient sampling and the parameters of the fabrication tool(s) at which the wafers were processed may be used to determine the thresholds. For example, the threshold between the enhanced sampling scheme and the optimal sampling scheme may be determined based on results of measurements performed on wafers processed at or near the edges of the process window. In another example, the threshold between the reduced sampling scheme and the optimal sampling scheme may be determined based on results of measurements performed on wafers processed at or near the center of the process window.

In one embodiment, the optimal sampling scheme, the enhanced sampling scheme, and the reduced sampling scheme include numbers of other wafers in other lots to be measured in the process. The numbers of wafers may include any number of the wafers in a lot (e.g., 1 wafer to all wafers in a lot). In addition, the numbers of wafers may include simply the number of the wafers that are to be measured without any other information about which wafers in the lots are to be measured. Alternatively, the numbers of wafers may include the number of wafers in a lot in addition to which wafers are to be processed (sampled) in the lot (e.g., wafers in slots 1, 3, 5, 7, 9, etc. of a container such as a pod in which the wafers are contained). The wafers that are selected for inclusion in the numbers of wafers measured may vary depending on the fabrication process performed on the wafers prior to the measurement process. For example, if wafers in a single lot are processed in more than one process chamber of a fabrication tool (e.g., more than one develop module of a lithography track), the wafers that are selected for inclusion in the numbers of wafers that are measured may include at least some wafers that are processed in all of the process chambers.

In another embodiment, the optimal sampling scheme, the enhanced sampling scheme, and the reduced sampling scheme include numbers of other wafers in other lots to be measured in the process and one or more parameters of the measurements to be performed on each of the other wafers during the process. The one or more parameters of the measurements may include, for example, the number of measurements to be performed on each of the other wafers. In addition, the one or more parameters of the measurements may include the locations of the measurements to be performed on each of the other wafers. Furthermore, the one or more parameters of the measurements may include values of any other adjustable parameter(s) of the measurement tool that is to be used for the measurements. Such adjustable parameters may include, for example, sensitivity, magnification, number of wavelengths at which the measurements are performed, the wavelength(s) at which the measurements are performed, the angles of incidence at which the measurements are performed, the polarization of the light used to perform the measurements, etc. Moreover, the one or more parameters of the measurements to be performed on each of the other wafers during the process may be selected to vary from wafer-to-wafer within a lot or from measurement spot-to-measurement spot across a wafer.

In one embodiment, the method includes performing the dynamic sampling scheme by performing the measurements on other wafers in other lots during the process, comparing values of the measurements performed on the other wafers to the thresholds, and determining which of the sampling schemes is to be used for the process during which the measurements are performed on additional wafers in additional lots based on results of the comparing step. In this manner, once a dynamic sampling scheme has been created as described herein, measurements of the next lot may be performed, and outcomes of these measurements may be compared to the thresholds. Based on this comparison, the corresponding sampling is selected for the measurements of the next lot.

For example, once a dynamic sampling scheme such as that shown in FIG. 3 is created by the method, the measurements may be performed on other wafers in other lots using the optimal sampling scheme. The values of these measurements may be compared to the thresholds. If the values of these measurements are between Thresholds 1 and 2, the optimal sampling scheme may be used for the measurement process performed on the next wafers. If the values of these measurements are below Threshold 1, the reduced sampling scheme may be selected for the measurement process performed on the next wafers. On the other hand, if the values of these measurements are above Threshold 2, the enhanced sampling scheme may be selected for the measurement process performed on the next wafers.

In this manner, the sampling scheme of the measurement process may be altered using a feedback control technique. For example, in one embodiment, the method to includes altering one or more parameters of a tool configured to perform the process prior to performing the measurements on the additional wafers. The tool may be configured as described further herein. The one or more parameters of the tool may be altered in any manner known in the art. In addition, the one or more parameters may include any adjustable parameter(s) of the tool.

The method for creating a dynamic sampling scheme for the process may also be performed at predetermined intervals. For example, after a predetermined interval (which may be measured in terms of time, wafers, lots, etc.), the omniscient sampling step may be performed again, and the optimal sampling scheme, the enhanced sampling scheme, the reduced sampling scheme, and the thresholds may be re-determined. Each of these steps may be performed as described herein. In this manner, periodically, omniscient sampling is applied again, and the samplings and thresholds are adjusted. As such, the dynamic sampling scheme may be re-created or updated periodically.

Examples of suitable predetermined intervals may be once a week, once every two weeks, or the like, which may be determined or selected by a user. Alternatively, the predetermined intervals may vary depending on the results of the omniscient sampling. For example, relatively large variations in the results of different omniscient sampling steps may indicate that the process is relatively instable. Therefore, the omniscient sampling step may be performed more often than for a process that exhibits relatively small variations in the results of different omniscient sampling steps. The predetermined intervals may be varied in this manner by the embodiments described herein (e.g., automatically (or without user intervention) based on results of the omniscient sampling).

Furthermore, predetermined intervals that are determined to be relatively short (e.g., once a day or twice a day) based on the omniscient sampling results may indicate a highly unstable process that may require adjustment, correction, maintenance, or some other action by an operator or engineer. In this manner, prior to implementing omniscient sampling with a different predetermined interval, the different predetermined interval may be compared to a threshold. If the predetermined interval is shorter than the threshold, the embodiments described herein may generate output indicating that the process should be evaluated by an operator or engineer to determine if adjustment, correction, maintenance, and/or some other action is appropriate. The output may include any suitable output such as an alarm detectable by an operator or engineer.

The embodiments of the method for creating a dynamic sampling scheme described above may include any other step(s) described herein. In addition, the embodiments of the method for creating a dynamic sampling scheme described above may be performed by any of the system embodiments described herein.

As described above, some embodiments include creating a dynamic sampling scheme. Other embodiments, however, may not necessarily include creating the dynamic sampling scheme. For example, different methods may be used to create the dynamic sampling scheme and to implement the dynamic sampling scheme. In one such embodiment, a method for dynamically selecting a sampling scheme for a process during which measurements are performed on wafers includes performing the measurements on at least one wafer in at least one lot using an optimal sampling scheme. The optimal sampling scheme may be determined as described above. Therefore, after a dynamic sampling scheme has been created as described above, the metrology process is first performed using the optimal sampling scheme. The measurements may include any of the measurements described herein.

This embodiment also includes comparing values of the measurements to thresholds that correspond to the values of the measurements at which an enhanced sampling scheme or a reduced sampling scheme is to be used for the process instead of the optimal sampling scheme. Comparing the values in this step may be performed as described herein. In addition, this embodiment includes selecting the optimal sampling scheme, the enhanced sampling scheme, or the reduced sampling scheme for the process during which the measurements are to be performed on at least one additional wafer in at least one additional lot based on results of the comparing step. This selecting step may be performed as described herein. In some embodiments, this embodiment includes altering one or more parameters of a tool configured to perform the process prior to performing the measurements on the at least one additional wafer. Altering the one or more parameters of the tool may be performed as described herein.

The embodiments of the method for dynamically selecting a sampling scheme described above may include any other step(s) described herein. In addition, the embodiments of the method for dynamically selecting a sampling scheme described above may be performed by any of the system embodiments described herein. Furthermore, these method embodiments have all of the advantages of other embodiments described herein.

Another embodiment relates to a method for sampling wafers during a measurement process. The measurement process may include any measurement process described herein. The method includes designing a plurality of sampling schemes for the measurement process. In one embodiment, designing the plurality of sampling schemes includes performing measurements on all wafers in at least one lot at all measurement spots on all of the wafers. Such measurements may be performed as described herein. Results of such measurements used in embodiments described further herein may include any results of any such measurements described herein. All of the measurement spots on all of the wafers may include any of the measurement spots described herein.

In one such embodiment, designing the plurality of sampling schemes includes determining, based on results of the measurements performed on all of the wafers, an optimal sampling scheme, an enhanced sampling scheme, and a reduced sampling scheme. Determining the optimal sampling scheme, the enhanced sampling scheme, and the reduced sampling scheme may be performed as described herein. In addition, in such an embodiment, designing the plurality of sampling schemes may include determining thresholds, based on the results of the measurements, that will be used to trigger the optimal sampling scheme, the enhanced sampling scheme, and the reduced sampling scheme. Determining the thresholds in this manner may be performed according to any of the embodiments described herein. As described further herein, the thresholds may be used to trigger the optimal sampling scheme, the enhanced sampling scheme, and the reduced sampling scheme for the wafers.

In some embodiments, designing the plurality of sampling schemes includes designing the plurality of sampling schemes based on results of measurements performed on all wafers in at least one lot at all measurement spots on all of the wafers, the results of the measurements include raw measurement data, and the method includes applying an absolute value or regression filter to the raw measurement data before designing the plurality of sampling schemes based on the raw measurement data. In this manner, designing the plurality of sampling schemes may be based on raw measurement data acquired by performing measurements on the wafers. The measurements may be performed in this embodiment as described herein. All of the measurement spots at which the measurements are performed may include any of the measurement spots described herein. In addition, the raw measurement data may include output generated by any detector(s), sensor(s), and the like of the measurement tool used to perform the measurements. The raw measurement data may include any output that can be generated by any measurement tool that can be used to perform the measurements described herein. In this manner, when analyzing raw measurement data to design the plurality of sampling schemes, a filter may be applied to the data (e.g., to remove outliers in the raw measurement data to thereby remove obvious errors in the data and/or to smooth the data) prior to using such data to design the plurality of sampling schemes. The filter may be an absolute value filter, a regression filter, or any suitable statistical filter known in the art. The filter may be applied to the raw measurement data in any suitable manner.

As described herein, designing the plurality of sampling schemes may be based on results of measurements. However, designing the plurality of sampling schemes may be based on information other than or in addition to results of the measurements. For example, in one embodiment, designing the plurality of sampling schemes includes designing the plurality of sampling schemes based on results of measurements performed on all wafers in at least one lot at all measurement spots on all of the wafers and based on information from one or more tools that performed one or more processes on all of the wafers. The one or more tools that performed one or more processes on the wafers may include any of the tools (e.g., fabrication or process tools) described herein. The plurality of sampling schemes may be designed in this manner as described herein. In a similar manner, the plurality of sampling schemes may be designed based on the results of such measurements in addition to information (e.g., results) from one or more other measurements performed on the wafers. Designing the sampling schemes may also include performing statistical analysis of any of these types of data.

In another embodiment, designing the plurality of sampling schemes includes designing the plurality of sampling schemes based on results of measurements performed on all wafers in at least one lot at all measurement spots on all of the wafers and based on historical process control data for one or more processes performed on all of the wafers. The historical process control data may include historical process control data as measured on the metrology tool or any other measurement tool for a certain process. In this manner, the plurality of sampling schemes can be designed based on results of omniscient sampling for a particular lot of wafers in addition to any or all other available metrology results for similar wafers processed using a similar process. In addition, the historical process control data may include any other data related to the historical process control of one or more process tools that performed one or more processes on the wafers. Such historical process control data may include, for example, information about how and when one or more parameters of the process tool were altered for process control purposes. Designing the sampling schemes may also include performing statistical analysis of any of these types of data. The sampling schemes may be designed in this manner as described herein.

In an additional embodiment, designing the plurality of sampling schemes includes designing the plurality of sampling schemes based on an optimization criterion and one or more constraints external to the measurement process. For example, designing the plurality of sampling schemes may include a statistical optimization method. The optimization method may include modeling and analyzing external constraints, such as the constraints in the design wafer layout (i.e., the layout or spatial arrangement in which the design is or will be printed on the wafer), the intra-field targets layout (i.e., the spatial arrangement or layout in which the targets are or will be printed within a field on the wafer), the tools, and the processes. For example, the constraints of a scanner can be modeled and analyzed. The statistical optimization method may also include applying an optimization criterion to determine sampling schemes that optimize the sampling of wafer while satisfying the external constraints. In one such example, if the measurement process will be performed during a fabrication process (i.e., in situ) such as a lithography process, the maximum allowable delay between the process steps between which the measurement process will be performed may be used to determine the optimal sampling of the wafers that can be performed in the allowable time. In a similar manner, if the measurement process will be performed during a process step of a fabrication process, the time in which the process step will be performed may be used as the maximum time allowable for the measurements and the optimal sampling may be determined based on that maximum allowable time.

Designing the plurality of sampling schemes may include determining either direct or non-direct thresholds operable to trigger the sampling schemes. For example, in some embodiments, designing the plurality of sampling schemes includes determining direct thresholds to be used for the triggering step. Direct thresholds are thresholds that correspond to values for data related to the processed wafers, one or more processes performed on the wafers, or one or more metrology tools that measured the processed wafers. For example, direct thresholds may be thresholds that correspond to values determined from measurement data for a specific lot or the population measurement data of the lot. Direct thresholds also may include thresholds corresponding to values of raw measurement data for the processed wafer, statistical properties of the measurement population, or statistical rules implemented on historical data. Furthermore, direct thresholds may include thresholds corresponding to values of data from the process or metrology tool that processed or measured the measured lot. In addition, the types of direct thresholds listed and described herein are not exhaustive, and the thresholds used in embodiments of the method may be any combination of the thresholds described herein.

In another embodiment, designing the plurality of sampling schemes includes determining non-direct thresholds to be used for the triggering step. Non-direct thresholds are thresholds that correspond to values for data related to the management of manufacturing and metrology processes. For example, a non-direct threshold may be based on time, process tool quality control data, production floor data, or material planning data. Time-based thresholds may include time data such as calendar time or a counter from a certain event in time. In one such example, the time-based threshold is the first Monday of each month. In another example, the time-based threshold is 10 days from which a specific sampling scheme was previously triggered. Planning data-based thresholds may include thresholds related to information such as the availability of tools and lots, the delivery schedule status of the lots, or any other planning data. In addition, such data can be crossbred with the throughput of different measurement modes to prioritize the different measurement modes for improving fabrication performance. For example, the time in which measurements can be performed using a particular measurement mode can be combined with information about the planning data and availability of the measurement tools and process tools to determine what the most efficient sampling of wafers would be for any particular measurement process. Furthermore, the types of non-direct thresholds listed and described herein are not exhaustive, and the thresholds used in embodiments of the method may be any combination of the thresholds described herein.

The method also includes triggering one of the plurality of sampling schemes for the wafers. Triggering one of the plurality of sampling schemes may include comparing values of relevant data to thresholds that correspond to the sampling schemes and triggering a sampling scheme based on results of the comparison. Embodiments of such relevant data and thresholds are described further herein, and the relevant data may be compared to the thresholds in any suitable manner. Appropriate relevant data and appropriate thresholds may be selected based on one or more characteristics of the wafers to be measured, one or more characteristics of one or more processes performed on the wafers, one or more characteristics of the measurement process, or some combination thereof.

In another embodiment, designing the plurality of sampling schemes includes designing the plurality of sampling schemes based on results of measurements performed on all wafers in at least one lot at all measurement spots on all of the wafers. Designing the plurality of sampling schemes based on results of such measurements may be performed according to any embodiments described herein. The results of the measurements may include any of the results of the measurements described herein. All of the measurement spots on all of the wafers may include any of the measurement spots described herein. In one such embodiment, the wafers for which the triggered sampling scheme is activated are in a lot other than the at least one lot. In this manner, the sampling schemes may be designed based on one lot of wafers, and the sampling schemes designed using this lot of wafers may be applied to wafers in other lots.

In one embodiment, triggering one of the sampling schemes is initiated by comparing results of measurements performed on all wafers in at least one lot at all measurement spots on all of the wafers to direct thresholds. The direct thresholds may include any of the direct thresholds described above and may be determined as described herein. Comparing results of such measurements to direct thresholds may be performed in any suitable manner. Whether a sampling scheme is triggered based on results of such a comparison may vary depending on the threshold. For example, in general, if the results of such measurements are above the threshold, a sampling scheme may be triggered, but that may not always be the case. In addition, a sampling scheme may be triggered based on a comparison of some variant of the results of such measurements. For example, in another embodiment, triggering one of the plurality of sampling schemes is initiated by comparing statistical properties of results of measurements performed on all wafers in at least one lot at all measurement spots on all of the wafers to direct thresholds. That statistical properties of the results of the measurements that are compared to the direct thresholds may include any of the statistical properties described herein.

Furthermore, the data that is compared to direct thresholds to determine if a sampling scheme should be triggered may vary depending on the thresholds themselves. For example, in an additional embodiment, triggering one of the plurality of sampling schemes is initiated by comparing historical process control data to direct thresholds. The historical process control data may include any of the historical process control data described herein. Such comparisons may be performed in any suitable manner, and the results of such comparisons may be used to initiate triggering one of the plurality of sampling schemes as described herein. In a further embodiment, triggering one of the plurality of sampling schemes is initiated by comparing data from one or more metrology tools or one or more process tools to direct thresholds. The data from one or more metrology tools or one or more process tools may include any of the data from metrology tools (e.g., results of measurements performed by the metrology tools, results of measurements performed by the metrology tools as a function of time, etc.) and process tools (e.g., information about one or more processes performed by the process tools)

described herein. Such comparisons may be performed in any suitable manner, and the results of such comparisons may be used to initiate triggering one of the plurality of sampling schemes as described herein.

In some embodiments, triggering one of the plurality of sampling schemes is initiated by comparing time data to non-direct thresholds. The non-direct thresholds may include any of the non-direct thresholds described above and may be determined as described herein. The time data may include any of the time data described herein. Such comparisons may be performed in any suitable manner, and the results of such comparisons may be used to initiate triggering one of the plurality of sampling schemes as described herein.

In another embodiment, triggering one of the plurality of sampling schemes is initiated by comparing process tool quality control data to non-direct thresholds. The process tool quality control data may include any of the process tool quality control data described herein. Such comparisons may be performed in any suitable manner, and the results of such comparisons may be used to initiate triggering one of the plurality of sampling schemes as described herein.

In an additional embodiment, triggering one of the plurality of sampling schemes is initiated by comparing production floor or material planning data to non-direct thresholds. The production floor or material planning data may include any of the production floor and material planning data described herein. Such comparisons may be performed in any suitable manner, and the results of such comparisons may be used to initiate triggering one of the plurality of sampling schemes as described herein.

In one embodiment, the triggering step includes the following steps. Measure overlay/CD/films using predefined sampling. Model results and predict measurements at non-measured points. If any non-measured prediction is above spec (i.e., the wafer should be reworked), perform measurements at this point. Compare with prediction. Such steps may be performed as described further herein and such an embodiment may include any other step(s) described herein.

The method further includes activating the triggered sampling scheme such that measurements are performed on the wafers during the measurement process using the triggered sampling scheme. Activating the triggered sampling scheme may include implementing the triggered sampling scheme on wafers in a lot (e.g., such that the triggered sampling scheme is used to sample the wafers during the measurement process). The sampling scheme that is triggered and activated may include any of the sampling schemes described herein.

The triggered sampling scheme may be implemented on the same lot that triggered the sampling scheme or on the following lots. For example, a sampling scheme that is triggered by information relating to a lot may be activated for the same lot. In addition, or alternatively, a sampling scheme that is triggered by information relating to a lot may be activated for one or more wafers in a different lot of wafers to be measured in the measurement process after the lot that triggered the sampling scheme. Moreover, the triggered sampling scheme may be implemented on the same wafers that triggered the sampling scheme or on other wafers in the same lot or following lots. For example, a sampling scheme that is triggered by information relating to wafers in a lot may be activated for the same wafers in that lot. In addition, or alternatively, a sampling scheme that is triggered by information relating to wafers in a lot may be activated for one or more other wafers in the same lot or one or more wafers in a different lot of wafers to be measured in the measurement process after the wafers that triggered the sampling scheme. Automatic implementation of the triggered sampling scheme may be desirable, and in such a case, the method may include on-line altering of the metrology tool recipe, the measurement targets, or the measurement mode.

The embodiments of the method described above may include any other step(s) described herein. In addition, the embodiments of the method described above may be performed by any of the system embodiments described herein. Furthermore, these method embodiments have all of the advantages of other embodiments described herein.

Various steps described above may be performed alone or in any combination thereof. For example, designing the sampling schemes may include the following options as standalone methods or in some combination thereof: performing, at a predetermined frequency, measurements on all wafers in at least one lot at all measurements spots on the wafers and determining an optimal sampling scheme, an enhanced sampling scheme, a reduced sampling scheme and thresholds for the dynamic sampling scheme for the process based on results of the measurements; implementing on the design wafer layout or on the intra-field targets layout and on tool/process model (e.g., a scanner model) a statistical optimization method that is based on a chosen optimization criterion, model that will be fit, certain constraints coming from process/tool/device issues, and determining an optimal sampling scheme, an enhanced sampling scheme, and a reduced sampling scheme; determining the optimal sampling scheme, the enhanced sampling scheme, and the reduced sampling scheme based on information from one or more tools that performed one or more other processes or measurements on the wafers optionally in combination with the results of the measurements; using a statistical method, analyzing the historical process control data as measured on the metrology tool for a certain process and defining the optimal sampling for the process and the thresholds for dynamic sampling; and in each of the methods described above that involve analyzing raw measurement data, a filter from the type of absolute value or regression can be implemented on the data before the sampling design analysis.

In another example, triggering the sampling may include: using a threshold; examples for the threshold are absolute values of measurements, statistical properties of the measurement population, statistical rules implemented on historical data or a combination of the previous; the triggering may be based on data from the process or metrology tool that the measured lot was processed or measured on, previously to the discussed metrology step; types of threshold are direct threshold used in the two above steps, implemented on a specific lot measurement data or the population measurement data for a lot, meaning the measured data of this lot or its population are compared to the threshold and any violation triggers the dynamic sampling, another type of threshold described in the two below steps are non-direct threshold; time-based threshold where time may be measured as calendar time or as a counter from a certain event in time; threshold that is based on process tool quality control data; threshold that is based on production floor and/or material planning data like availability of the tools, availability of the lots, delivery schedule status of the lots, etc. One option is to crossbreed the above data with the different measurement's mode throughput and to prioritize the different measurement's mode for improving fab performance.

In an additional example, activating the new sampling: may be implemented on the same lot that triggered the dynamic sampling or on the following lots; may be implemented on the same wafers that trigger the dynamic sampling or on other wafers in the current lot or other lots; or may be implemented automatically (e.g., on-line altering the metrology tool recipe and/or altering the measurement targets or mode).

Figure 4:
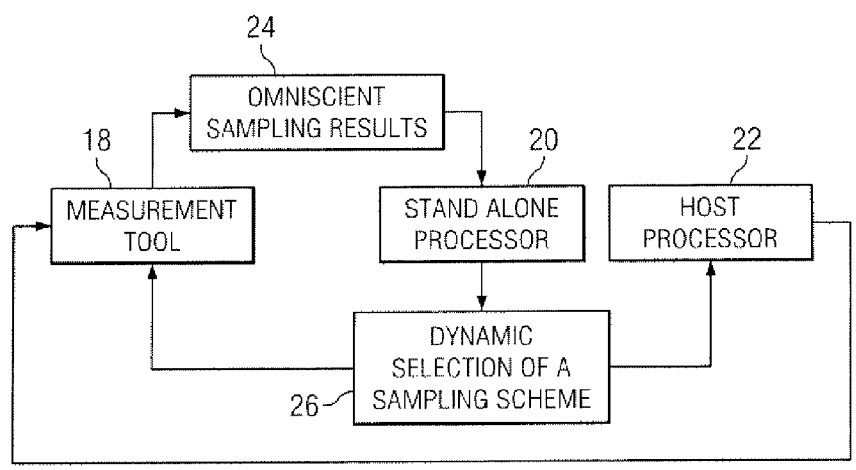
FIG. 4 is a block diagram illustrating one embodiment of a system configured to create a dynamic sampling scheme for a process during which measurements are performed on wafers.

Another embodiment relates to a system configured to create a dynamic sampling scheme for a process during which measurements are performed on wafers. One embodiment of such a system is shown in FIG. 4. As shown in FIG. 4, the system includes measurement tool 18 that is configured to perform the measurements on the wafers (not shown in FIG. 4). The measurement tool may be configured as described further herein. For example, in one embodiment, the measurement tool is configured as a metrology tool. In addition, measurement tool 18 may include any other suitable measurement tool known in the art.

The system also includes one or more processors configured to control the measurement tool to perform the measurements on all of the wafers in at least one lot at all measurement spots on the wafers. As described further above, all of the measurement spots may include all fields on the wafers, all targets on the wafers, or all fields and all targets on the wafers. In this manner, the one or more processors are configured to control the measurement tool such that the measurement tool performs omniscient sampling. Omniscient sampling may be performed by the measurement tool as described herein.

The one or more processors may be configured to control the measurement tool in any manner known in the art. For example, the one or more processors may send a recipe (or a set of instructions) to a processor (not shown) of the measurement tool or a control subsystem (not shown) of the measurement tool with an instruction to perform the recipe. In this manner, the system may use a recipe to control the measurement tool to perform omniscient sampling once per period (predetermined interval) to measure all wafers and all fields and/or all targets on the wafers for at least one lot. The recipe and the instructions may have any suitable format known in the art.

The one or more processors that are configured to control the measurement tool such that the measurement tool performs omniscient sampling may include the processor of the measurement tool. Such a processor may be configured as described herein. In another example, the one or more processors that are configured to perform this step may include stand alone processor 20. Stand alone processor 20 may be a processor of a computer system that is not part of the measurement tool. In particular, stand alone processor 20 may be coupled to the measurement tool (e.g., coupled to a processor or a storage medium of the measurement tool via one or more transmission media, that may include "wired" and/or "wireless" portions), but does not constitute the main processor of the measurement tool. In other words, the stand alone processor may be configured to perform one or more functions "off-line." In a further example, the one or more processors that are configured to perform this step may include host processor 22. Host processor 22 may be configured as described above with respect to stand alone processor 20.

Each of the one or more processors, which may include any of the processors described above, may take various forms, including a personal computer system, mainframe computer system, workstation, image computer, parallel processor, or any other device known in the art. In general, the term "computer system" may be broadly defined to encompass any device having one or more processors, which executes instructions from a memory medium.

As shown in FIG. 4, measurement tool 18 produces omniscient sampling results 24. The one or more processors are also configured to determine an optimal sampling scheme, an enhanced sampling scheme, a reduced sampling scheme, and thresholds for the dynamic sampling scheme for the process based on results of the measurements. The thresholds correspond to values of the measurements at which the optimal sampling scheme, the enhanced sampling scheme, and the reduced sampling scheme are to be used for the process. The optimal sampling scheme, the enhanced sampling scheme, the reduced sampling scheme, and the thresholds may be determined as described above using omniscient sampling results 24. For example, in one embodiment, the one or more processors are configured to determine the optimal sampling scheme, the enhanced sampling scheme, and the reduced sampling scheme based on the results of the measurements in combination with information from one or more tools that performed one or more other processes on the wafers. This determining step may be performed as described further herein. In addition, the results of the measurements may include any of the results described herein. For example, in one embodiment, the results of the measurements include information about variation in the measurements.

The one or more processors that are configured to perform this step may include the processor of the measurement tool. Alternatively, the one or more processors that are configured to perform this step may include stand alone processor 20. For example, omniscient sampling results 24 may be sent from measurement tool 18 to stand alone processor 20. The system may include analysis software or program instructions (not shown) that are executable on stand alone processor 20 for analyzing the data from the omniscient sampling and selecting optimal and alternative sampling schemes and thresholds. In this manner, the omniscient data from the tool may be sent to the analysis software which is on a computer that includes stand alone processor 20. Therefore, in one embodiment, stand alone processor 20 may be configured to both control the measurement tool to perform the omniscient sampling and to determine the parameters of the dynamic sampling scheme.

Program instructions implementing methods such as those described herein or steps of the methods described herein may be transmitted over or stored on a computer-readable medium (not shown). The computer-readable medium may be a transmission medium such as a wire, cable, or wireless transmission link. The computer-readable medium may also be a storage medium such as a read-only memory, a random access memory, a magnetic or optical disk, or a magnetic tape.

The program instructions may be implemented in any of various ways, including procedure-based techniques, component-based techniques, and/or object-oriented techniques, among others. For example, the program instructions may be implemented using Matlab, Visual Basic, ActiveX controls, C, C++ objects, C#, JavaBeans, Microsoft Foundation Classes ("MFC"), or other technologies or methodologies, as desired.

The dynamic sampling scheme may be further configured as described herein. For example, in one embodiment, the optimal sampling scheme, the enhanced sampling scheme, and the reduced sampling scheme include numbers of other wafers in other lots to be measured in the process. In another embodiment, the optimal sampling scheme, the enhanced sampling scheme, and the reduced sampling scheme include numbers of other wafers in other lots to be measured in the process and one or more parameters of the measurements to be performed on each of the other wafers during the process.

In one embodiment, the one or more processors are configured to perform the dynamic sampling scheme by comparing values of the measurements performed on other wafers in other lots to the thresholds and determining which of the sampling schemes is to be used for the process during which the measurements are performed on additional wafers in additional lots based on results of the comparing step. For example, values of the measurements performed on other wafers in other lots by measurement tool 18 may be acquired by stand alone processor 20. Stand alone processor 20 may compare the values acquired from the measurement tool to the thresholds. In addition, stand alone processor 20 may determine which of the sampling schemes is to be used for the process performed on additional wafers in additional lots based on results of this comparison. In this manner, stand alone processor 20 may be configured as a decision engine that compares analyzed data from lot(s) with the thresholds and decides which sampling scheme should be used for the next lot(s). Results of these steps generated by the stand alone processor may include dynamic selection of a sampling scheme 26, as shown in FIG. 4. The results of these steps may be sent from the stand alone processor to measurement tool 18 and/or to host processor 22.

In another embodiment, the omniscient sampling results from the measurement tool are sent to analysis software that is executable on stand alone processor 20. The analysis software analyzes the results and sends the optimal sampling scheme to the measurement tool. The alternative sampling schemes are sent to the host processor. The next lot is measured by the measurement tool using the optimal sampling scheme. Results for this lot are sent to the analysis software. The analysis software analyzes the results and compares the results with the thresholds. If adjustment of the sampling is selected based on the results of the comparison, an alternative sampling scheme can be sent from the host processor to the tool.

In one such embodiment, the one or more processors are configured to alter one or more parameters of the measurement tool before the measurement tool performs the process on the additional wafers. For example, stand alone processor 20 may be configured to alter one or more parameters of the measurement tool in this manner by sending dynamic selection of a sampling scheme 26 to measurement tool 18 along with instructions to alter one or more parameters of the measurement tool such that any additional measurements performed by the measurement tool are performed with the dynamically selected sampling scheme. Alternatively, host processor 22 may be configured to alter the one or more parameters of the measurement tool as described above. In this manner, the host processor may send the adjusted sampling scheme to the measurement tool. The one or more parameters of the measurement tool may also be altered as described further herein.

Each of the embodiments of the system shown in FIG. 4 may be configured to perform any other step(s) described herein. For example, in one embodiment, the system is configured to create the dynamic sampling scheme at predetermined intervals. In this manner, the system may be configured to periodically update the dynamic sampling scheme. Each of the embodiments of the system described above may also be further configured as described herein and has all of the advantages of other embodiments described herein.

Figure 5:
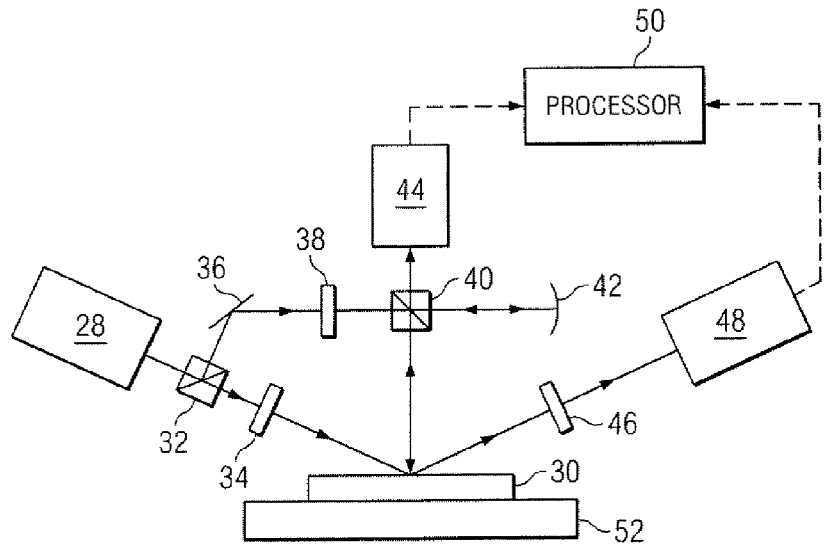
FIG. 5 is a schematic diagram illustrating a side view of one embodiment of a measurement tool configured to perform measurements on wafers.

FIG. 5 illustrates one embodiment of a measurement tool that may be included in the system embodiments described herein. The measurement tool is configured to perform measurements on wafers. It is noted that FIG. 5 is provided herein to generally illustrate one configuration of a measurement tool that may be included in the system embodiments described herein. Obviously, the measurement tool configuration described herein may be altered to optimize the performance of the measurement tool as is normally performed when designing a commercial measurement tool. In addition, the systems described herein may be implemented using an existing measurement tool (e.g., by adding functionality described herein to an existing measurement tool). For some such systems, the methods described herein may be provided as optional functionality of the measurement tool (e.g., in addition to other functionality of the measurement tool). Alternatively, the measurement tool described herein may be designed "from scratch" to provide a completely new system.

The measurement tool shown in FIG. 5 includes light source 28. Light source 28 may include a single wavelength light source such as a laser. However, in many instances, it may be advantageous for the tool to be configured to perform measurements at more than one wavelength. In one such instance, light source 28 may include a polychromatic light source such as a multi-wavelength laser if the tool is configured to perform measurements at more than one wavelength. In another alternative, light source 28 may include a broadband light source such as an arc lamp if the tool is configured to perform the measurements across a spectrum of wavelengths. Light source 28 may include any other suitable light source known in the art.

Light from light source 28 may be directed to wafer 30 at an oblique angle of incidence. In some embodiments, light from light source 28 may also or alternatively be directed to wafer 30 at a normal angle of incidence. For instance, the tool may include beam splitter 32. Beam splitter 32 may include any suitable bear splitter known in the art. Beam splitter 32 may transmit a portion of the light from light source 28 to polarizing component 34. Polarizing component 34 may include any suitable polarizing component known in the art. Light transmitted by polarizing component 34 is directed to wafer 30 at an oblique angle of incidence. The oblique angle of incidence may be any suitable oblique angle of incidence known in the art.

Beam splitter 32 may reflect the other portion of the light from light source 28 to reflective optical component 36. Reflective optical component 36 may include any suitable reflective optical component known in the art such as a flat mirror. Reflective optical component 36 is configured to direct the light through polarizing component 38 to beam splitter 40. Polarizing component 38 may include any suitable polarizing component known in the art. Beam splitter 40 may include any suitable beam splitter known in the art. Beam splitter 40 may reflect a portion of the light to wafer 30 at a substantially normal angle of incidence. Beam splitter 40 may also transmit a portion of the light to reflective optical component 42. Reflective optical component 42 may include any suitable reflective optical component known in the art such as a curved mirror.

Normal incidence illumination reflected from wafer 30 may be transmitted by beam splitter 40 to detector 44. Light reflected from reflective optical component 42 may be reflected by beam splitter 40 to detector 44. The tool may also include polarizing component 46 through which oblique incidence illumination reflected or scattered from wafer 30 may pass. Polarizing component 46 may include any suitable polarizing component known in the art. Light that passes through polarizing component 46 is detected by detector 48.

Detectors 44 and 48 may be selected based on the wavelength(s) used for the measurements. In addition, the detectors may be selected based on the type of measurements to be performed by the measurement tool. For instance, the detectors may include imaging detectors if the tool is configured to optically form an image of the wafer.

Detectors 44 and 48 are coupled to processor 50 via transmission media shown by the dashed lines in FIG. 5. The transmission media may include any suitable transmission media known in the art. In this manner, the processor may receive output generated by detectors 44 and 48. Processor 50 may also be configured to use the output to determine one or more characteristics of the wafer. Processor 50 may be further configured as described herein. During measurements, wafer 30 is disposed on stage 52 of the measurement tool. Stage 52 may include any appropriate mechanical and/or robotic assembly known in the art.

The components of the tool shown in FIG. 5 that are included in a particular embodiment of the tool or are used for a particular measurement can vary depending on the measurement technique or techniques that are selected. For instance, the tool may be configured to perform measurements of wafer 30 using scatterometry, ellipsometry, reflectometry, polarized reflectometry, interferometry, or some combination thereof.

In one such embodiment, if the tool is configured to perform scatterometry measurements, the tool may be configured to direct light from light source 28 to wafer 30 at an oblique angle of incidence. In this embodiment, beam splitter 32 and polarizing component 34 may not be included in the tool or may be moved out of the illumination path of the tool during these measurements. In addition, in this embodiment, polarizing component 46 may not be included in the tool or may be moved out of the collection path of the tool during these measurements. Light scattered from the wafer is detected by detector 48. In particular, light scattered by the features of the wafer into one or more diffraction orders may be detected by detector 48. In this manner, output generated by detector 48 includes scatterometry measurements of the wafer. The tool may be configured to perform the scatterometry measurements at a single wavelength, at more than one wavelength, or across a spectrum of wavelengths (i.e., spectroscopic scatterometry).

In another such embodiment, if the tool is configured to perform ellipsometry measurements, the tool may be configured to direct light from light source 28 through polarizing component 34 to wafer 30 at an oblique angle of incidence. Therefore, polarizing component 34 may be configured to function as a polarizer in this embodiment. In this embodiment, beam splitter 32 may not be included in the tool or may be moved out of the illumination path during these measurements. Light reflected from the wafer passes through polarizing component 46 and is detected by detector 48. Therefore, polarizing component 46 may be configured to function as an analyzer in this embodiment, and output generated by detector 48 includes ellipsometry measurements. The tool may be configured such that polarizing component 34 or polarizing component 46 rotates during these measurements. Therefore, the tool may be configured as a rotating polarizer ellipsometer or a rotating analyzer ellipsometer. In addition, the tool may be configured to perform the ellipsometry measurements at a single wavelength, at more than one wavelength, or across a spectrum of wavelengths (i.e., spectroscopic ellipsometry).

In a further embodiment, if the tool is configured to perform reflectometry measurements, the tool may be configured to direct light from light source 28 to beam splitter 32. Light that is reflected by beam splitter 32 is directed to reflective optical component 36. Reflective optical component 36 directs the light to beam splitter 40. In this embodiment, polarizing component 38 may not be included in the tool or may be moved out of the illumination path during the reflectometry measurements. Light reflected by beam splitter 40 is directed to wafer 30 at a substantially normal angle of incidence. In this embodiment, beam splitter 40 may not be configured to transmit a portion of the illumination to reflective optical component 42, or reflective optical component 42 may not be included in the tool. Normal incidence illumination that is spectrally reflected by wafer 30 passes through beam splitter 40 and is detected by detector 44. In this manner, output generated by detector 44 includes reflectometry measurements of the wafer. The tool may be configured to perform the reflectometry measurements at a single wavelength, at more than one wavelength, or across a spectrum of wavelengths (i.e., spectroscopic reflectometry).

In another embodiment, if the tool is configured to perform polarized reflectometry, the tool may be configured as described above for reflectometry measurements. However, for polarized reflectometry measurements, polarizing component 38 may be disposed in the illumination path as shown in FIG. 5. In this embodiment, polarizing component 38 may be configured such that light can be directed to wafer 30 at a selected polarization or at a variety of polarizations. In this manner, output generated by detector 44 includes polarized reflectometry measurements of the wafer. The tool may be configured to perform the polarized reflectometry measurements at a single wavelength, at more than one wavelength, or across a spectrum of wavelengths (i.e., spectroscopic polarized reflectometry).

In some embodiments, if the tool is configured to perform interferometry measurements of the wafer, the tool may be configured to direct light from light source 28 to beam splitter 32. Light that is reflected by beam splitter 32 is directed to reflective optical component 36. Reflective optical component 36 directs the light to beam splitter 40. In this embodiment, polarizing component 38 may not be included in the tool or may be moved out of the illumination path during the interferometry measurements. Light reflected by beam splitter 40 is directed to wafer 30 at a substantially normal angle of incidence. Light transmitted by beam splitter 40 is directed to reflective optical component 42. Light reflected by the wafer is transmitted through beam splitter 40. In addition, light reflected from reflective optical component 42 is reflected by beam splitter 40. Therefore, the light reflected by the wafer and the light reflected by optical component 42 may interfere, and the interference between the two beams of light can be detected by detector 44. In this manner, output generated by detector 44 can include interferometry measurements of the wafer. The tool may be configured to perform the interferometry measurements at a single wavelength, at more than one wavelength, or across a spectrum of wavelengths.

The tool shown in FIG. 5 is, therefore, advantageously configured to perform different types of measurements of wafer 30 including scatterometry, ellipsometry, reflectometry, polarized reflectometry, and interferometry measurements by altering the position of one or more of the components of the tool shown in FIG. 5. Such a configuration is advantageous since multiple types of measurements may be used in combination to determine more characteristics or more accurate characteristics of the wafer. Of course, the tool may be configured to perform only a subset of these measurement techniques. For example, the tool may be configured for scatterometry and ellipsometry measurements of the wafer. In another example, the tool may be configured for reflectometry and interferometry measurements of the wafer. In addition, the tool may be configured to perform two or more of any of the measurement techniques described herein on wafer 30.

Furthermore, although one configuration of the tool is shown in FIG. 5, it is to be understood that various changes can be made to the tool, and the tool will still be configured within the scope of the embodiments described herein. For instance, one or more lenses (not shown) may be positioned in the illumination paths and the collection paths of the tool. In addition, the angles and the spacings between the optical components may be varied from that shown in FIG. 5, for example, to optimize performance of the tool. The single light source shown in FIG. 5 may also be replaced by multiple light sources (not shown) (e.g., one for normal incidence illumination and one for oblique incidence illumination). The multiple light sources may be light sources of the same or different types. The measurement tool shown in FIG. 5 may be further configured according to any embodiments described herein.

The current state of the art in semiconductor manufacturing does not utilize direct feedback or feedforward of high-order wafer- and field-level stress or topography metrology results to control patterning, deposition, and thermal processing tools. Currently, users rely on keeping the stress introduced to wafers at each process step below some (process-specific) predetermined control limit in order to maintain the overall stress level. Various methods of measuring the stress in films deposited on semiconductor wafers are known in the art. Most commonly, the measurement is performed by measuring the shape of the wafer before a process step and then repeating the shape measurement after the process step. The stress of a film deposited (or removed) during the process step is determined from the change in the shape of the wafer, the thickness of the wafer and film (either or both of which may be known prior to the shape measurement or may be measured by the same system that performs the shape measurement), and the known elastic modulus of the semiconductor material that makes up the bulk of the wafer. If the stress and film thickness are reasonably uniform across the wafer and if the change in the shape of the wafer is not large compared with the thickness of the wafer (all of which conditions are usually satisfied by most semiconductor manufacturing process steps), then Stoney's equation (G. G. Stoney (1909), Proc. Roy. Soc. A82, 172) may be used to calculate the film stress from the change in wafer curvature deduced from the change in wafer shape.

U.S. Pat. No. 5,134,303 to Blech et al. and U.S Pat. No. 5,248,889 to Blech et al., which are incorporated by reference as if fully set forth herein, disclose a technique for scanning laser beams along a diameter of a wafer in order to measure the slope and, hence, curvature of the wafer. Either the beam is scanned across the wafer or the wafer is moved under the beam in order to perform the measurement. If the stress of the film is uniform, measurement of a single diameter usually suffices. If the stress of the film is non-uniform, measurements of multiple diameters would be needed to build up a more complete picture of the wafer curvature.

U.S. Pat. No. 5,912,738 to Chason et al., which is incorporated by reference as if fully set forth herein, describes a technique that uses multiple laser beams to make simultaneous measurements of slope at multiple locations on a wafer, thus speeding up the measurement by reducing, or eliminating, the need for relative scanning of the beam and wafer.

U.S. Pat. No. 6,031,611 to Rosakis et al., which is incorporated by reference as if fully set forth herein, describes a technique that is capable of measuring slope (in one direction) simultaneously at many points across the whole surface of a wafer. A second measurement can be made with the wafer rotated 90° in order to measure the other tilt component if that is also desired.

As an alternative to measuring the tilt of the wafer, it is also possible to measure the displacement of the wafer as a function of position across the wafer. U.S. Pat. No. 4,750,141 to Judell et al., which is incorporated by reference as if fully set forth herein, discloses such a technique. The displacement measurement may be performed with capacitive sensors (as disclosed by Judell et al.) or by optical or other means. U.S. Pat. No. 6,100,977 to Muller and U.S. Pat. No. 6,847,458 to Freischlad et al., which are incorporated by reference as if fully set forth herein, disclose techniques that are capable of essentially simultaneously measuring the displacement of both sides of the wafer using optical interferometers.

Other methods of measuring stress are known in the art. These other methods are generally less convenient for use in a production environment than the change in wafer shape metrology just described, because these other techniques are generally slower or require more expensive hardware.

High-resolution X-ray diffraction can measure the strain of the lattice of the semiconductor that makes up the bulk of the wafer (see, for example, "High Resolution X-ray Diffractometry and Topography" D. K. Bowen, B. K. Tanner (1998), CRC Press, ISBN 0-8506-6758-5, which is incorporated by reference as if fully set forth herein). Since the elastic properties of common semiconductor materials are well known, a measurement of strain can be used to compute stress. Since the measurement of lattice constants depends only on the knowledge of the wavelength of the X-rays and of the angles of incidence and reflection of the X-rays, substantially accurate measurements of strain can be made by X-ray diffraction. But the slowness of the measurement and the complexity of the apparatus make this technique more suitable for use as a reference technique than as a routine production metrology technique that is used to measure tens or hundreds of wafers per day.

Raman spectroscopy can measure semiconductor lattice strain because the shift of the Raman line depends on the strain of the semiconductor (see, for example, "Raman Microscopy", G. Turrell and J. Corset (Eds.), pp. 27-277, (1996), Academic Press, ISBN 0-12-189690-0, which is incorporated by reference as if fully set forth herein). This technique will only work if the overlying films on the wafer do not interfere with the Raman lines from the underlying material. The apparatus for Raman spectroscopy is complex compared with that for shape measurement, and the sensitivity and signal-to-noise are poor because the Raman lines in semiconductors are substantially weak relative to the incident laser line. For all of these reasons, Raman spectroscopy is not suitable for routine production measurements.

With respect to overlay metrology, extensive work has been performed using many different optical, algorithm, and mark architectures which are relied on for this purpose. The current state of the art is, for example, the Archer 100 overlay metrology tool that is commercially available from KLA-Tencor, San Jose, Calif., which operates on the principle of high resolution bright field imaging of either box in box and periodic (AIM) two layer metrology structures. In this system, the displacement between the centers of symmetry of two or more features, sequentially generated in a number of patterning steps is determined by image processing of images acquired through a microscope and stored digitally. An alternative to this technique is that known as scatterometry overlay in which information is extracted from the intensity of light reflected from a periodic overlay mark, which includes gratings printed over gratings in subsequent patterning steps. In this approach, several overlay cells, with different intentional offsets between the two gratings of each cell, are formed in close proximity. The difference between the intensities of light scattered from these overlay marks allows a model-free determination of the overlay error.

Simply controlling global wafer stress below some threshold is no longer sufficient as the depth of focus and overlay control required for the smallest dimensions printed on the wafer shrink. Intrinsic wafer topography and stress in addition to incremental modifications of wafer topography and/or stress induced by advanced thermal and deposition processing tools contribute a non-negligible amount to the overlay and focus control error budget, due to the fact that state of the art patterning tool control loops address only linear variations in overlay across the wafer and across the exposure tool field.

Furthermore, some new materials and new processes are prone to producing highly non-uniform stress within a wafer and so global stress measurements are not sufficient to track stress. In particular, rapid thermal annealing (sometimes referred to as "spike anneal") used to anneal semiconductor wafers after certain implant process steps has to heat and cool the wafer substantially rapidly in order to minimize the time the wafer spends at high temperatures to limit diffusion of the implanted atoms within the wafer. Such heating and cooling means that the wafer is subjected to significant stresses as different parts of the wafer heat and cool at different rates. Some of those stresses remain "frozen in" after the wafer has cooled. Laser-based spike anneal uses a laser to rapidly heat the wafer in an attempt to achieve substantially high surface temperatures in a substantially short time. But the laser is not powerful enough to heat the whole wafer surface simultaneously. Therefore, sections or strips across the wafer are annealed one at a time eventually covering the whole wafer surface. Because only a part of the wafer is at high temperature at any one time, substantially high stresses can be generated and some of these stresses remain after processing. Non-uniform stresses in a wafer will distort the local shape of the wafer in complex ways. As well as in-plane distortions, the wafer will bend out of its plane.

The manufacture of a modern integrated circuit chip requires many different patterns to be layered one on another. Each new pattern has to substantially accurately register with the patterns already on the chip. The exposure system (scanner or stepper), that prints the pattern on the wafer, contains subsystems that measure the location, height and tilt of the existing pattern(s) formed on the wafer. The time available to make these measurements is limited because these measurements have to be performed while the previous wafer is being exposed. Therefore, the number of measurements that can be made is limited.

If the stress changes between one patterning step and the next, the shape of the wafer in X, Y and Z can change. If the change in stress is substantially uniform, then the shape changes can generally be represented accurately enough as linear distortions of the shape. In such a case, the measurements made by the exposure system are often sufficiently accurate to correct for the distortions. But if the changes in stress are non-uniform, then the shape changes are complex, and linear models may not be accurate enough. The exposure system attempts to make the wafer as flat as possible by using a vacuum to pull or "suck" the wafer down onto a substantially precisely machined flat chuck. Typically, in order to minimize the contact area, the chuck uses a relatively large number of pins to support the wafer. Because of the vacuum, atmospheric pressure plus gravity forces the wafer down on to the pins and also causes some sag of the wafer between pins (which are, by design, closely spaced so as to minimize the sag). The stresses in the wafer, the atmospheric pressure and force of gravity on the wafer, and the forces of the pins on the wafer where the wafer contacts the pins all interact to determine the shape of the wafer.

"Across Wafer Focus Mapping and Its Applications in Advanced Technology Nodes" by Zhang et al., Proc. of SPIE, Vol. 6154, pp. 61540N-1-61540N-10, which is incorporated by reference as if fully set forth herein, shows examples in which wafer defocus of 50 nm causes overlay shifts of approximately 10 nm. At the 32 nm node, the overall budget for overlay accuracy on critical layers is expected to be approximately 5.7 nm $3\sigma$ (2005 ITRS roadmap). A fraction of this amount (perhaps about 50%) can be allocated to overlay caused by defocus. Based on these numbers, no more than about 15 nm of defocus could be tolerated at the 32 nm node. Without dynamic adjustment of focus and/or overlay, the wafer would be required to be flat to ± about 15 nm within the area of a die in order to keep overlay registration within the required limits. Exposure systems do adjust the leveling of each individual die before printing, but the leveling only corrects for average slopes in the X and Y directions (i.e., a tilted plane) and not for vertical distortions on scale lengths shorter than a die.

The complex distortions of the shape of the wafer in X, Y, and possibly Z, on the chuck due to the nonuniform changes in stress are not adequately accounted for by the exposure system thereby leading to regions of the wafer where yield is relatively low due to relatively poor alignment of one pattern with earlier patterns on chips in those regions of the wafer.

The embodiments described herein generally provide a control loop in which stress and/or shape and/or overlay metrology data, acquired at relatively high spatial density across the wafer, is used to determine corrections by various modeling methods and subsequently used to implement high-order overlay and focus corrections to the patterning process. In this way, the patterning process may include compensating for deformations induced in wafers in process steps prior to patterning. The embodiments described herein are different than currently used methods and systems for correcting overlay and focus since in currently used exposure systems, there are relatively severe constraints on the time available to perform metrology on the wafer in preparation for the patterning step. Due to these time constraints, in-situ metrology processes do not currently include relatively high density sampling for stress and deformation metrology in order to enable high-order focus and overlay compensation during the subsequent pattering step.

Another embodiment relates to a method for patterning a wafer. The method may be used for modifying a patterning process with corrections to compensate for wafer deformation. The patterning process may include any process that includes patterning a wafer during a wafer manufacturing process. The wafer may have been deformed prior to being patterned. As described further herein, the wafer patterning method generally relates to the utilization of various results of stress, topography (shape), and overlay metrology in feedforward and/or feedback control loops to modify one or more parameters of the manufacturing process performed by process tools such as patterning, deposition, and thermal processing tools in order to compensate for the deformation of the wafer and enhance die yield in the semiconductor device manufacturing process.

The method includes performing measurements on the wafer. In one embodiment, performing the measurements includes performing the measurements at all measurement spots on the wafer. In this manner, the measurements may be performed at a substantially high sampling density. The measurements may be performed using the dynamic sampling methods disclosed herein. In this manner, results of the measurements (e.g., metrology data) may be acquired using the dynamic sampling methods described herein. However, while the patterning method may incorporate a dynamic sampling method disclosed herein, the patterning method and dynamic sampling method each may be implemented independently.

In some embodiments, the results of the measurements include stress metrology data. In another embodiment, the results of the measurements include shape metrology data. In an additional embodiment, the results of the measurements include overlay metrology data. The stress, shape, or overlay metrology data may be acquired at relatively high spatial density across the wafer (e.g., all or a substantial portion of the fields on the wafer and/or all or a substantial portion of the targets on the wafer). In addition, the results of the measurements may include stress, shape, or overlay metrology data or any combination thereof. Such measurements may be performed using a measurement tool described herein (e.g., the measurement tool shown in FIG. 5).

The method also includes modeling deformation of the wafer based on results of the measurements. Various modeling methods known in the art may be used to analyze the results of the measurements (e.g., metrology data). In one embodiment, modeling the deformation includes estimating the deformation the wafer will have when the wafer is placed on a stage (or chuck) of the patterning tool. In another embodiment, modeling the deformation includes simulating effects of the deformation on the patterning of a design pattern on the wafer.

In addition, the method includes altering one or more parameters of a patterning tool based on the deformation of the wafer. For example, altering the one or more parameters may include generating corrections to the parameters to compensate for the deformation of the wafer and modifying the parameters with the corrections. In addition, altering the one or more parameters of the patterning tool may be performed using a feedforward control loop in which results of measurements such as stress, shape, or overlay metrology data acquired at relatively high spatial density across the wafer are used to modify the patterning process. Altering the one or more parameters of the patterning process may include determining high-order overlay corrections to compensate for the deformation of the wafer. For instance, the high-order overlay corrections may be determined such that the design pattern being printed on the wafer during the patterning process is printed in the correct (or substantially correct) positions with respect to other patterns printed on the wafer (e.g., patterns printed on another layer or other layers of the wafer) despite the deformation of the wafer. In this manner, altering the one or more parameters of the patterning process can reduce overlay misregistration (i.e., misregistration of one layer of a design pattern on a wafer with respect to another layer of the design pattern on the wafer) that may otherwise be caused by the deformation of the wafer. The one or more parameters of the patterning tool may be altered in any suitable manner prior to a patterning process performed by the patterning tool (e.g., by altering one or more parameters of a recipe or set of instructions that will be used by the patterning tool to perform patterning of the wafer).

After altering the one or more parameters of the patterning tool, the method further includes patterning the wafer using the patterning tool to produce a first patterned wafer. In this manner, after the corrections are made to the parameters, the corrected parameters can be implemented during the patterning process. Patterning the wafer may include patterning a design pattern on the wafer to produce the first patterned wafer.

In one embodiment, the method includes performing additional measurements on the first patterned wafer. In one such embodiment, the method also includes altering the one or more parameters of the patterning tool based on results of the additional measurements. In one such embodiment, after altering the one or more parameters of the patterning tool based on the results of the additional measurements, the method includes patterning a second wafer using the patterning tool to produce a second patterned wafer. In this manner, after the first patterned wafer has been produced, the method may include performing additional measurements on the first patterned wafer, generating new corrections to the parameters based on results of the additional measurements on the first patterned wafer, modifying the parameters with the new corrections, and patterning the design pattern on a second wafer to produce a second patterned wafer.

In one embodiment, the results of the additional measurements include overlay metrology data. In another embodiment, the results of the additional measurements include focus metrology data. The focus metrology data may include exposure system (e.g., scanner) data such as multiple locations' focus data per field (how many focus points per field depends on the configuration of the exposure system) and for all fields on the wafer. In an additional embodiment, the results of the additional measurements include dose metrology data. In addition, the results of the additional measurements may include overlay metrology data, dose metrology data, focus metrology data, or some combination thereof. The additional measurements may be performed according to any embodiments described herein and using any of the system embodiments described herein.

In one embodiment, the first and second patterned wafers are in the same lot. In a different embodiment, the first and second patterned wafers are in different lots. In this manner, the first and second patterned wafers may be in one lot or different lots. In addition, the results of the measurements of the first patterned wafer may be input to a control loop such as a feedback loop. For example, the feedback loop may include feeding metrology data acquired after the patterning of a wafer back to modify the parameters of the manufacturing process for the next wafer or lot.

Each of the steps of each of the embodiments of the method described above may be performed as described further herein.

Figure 6:
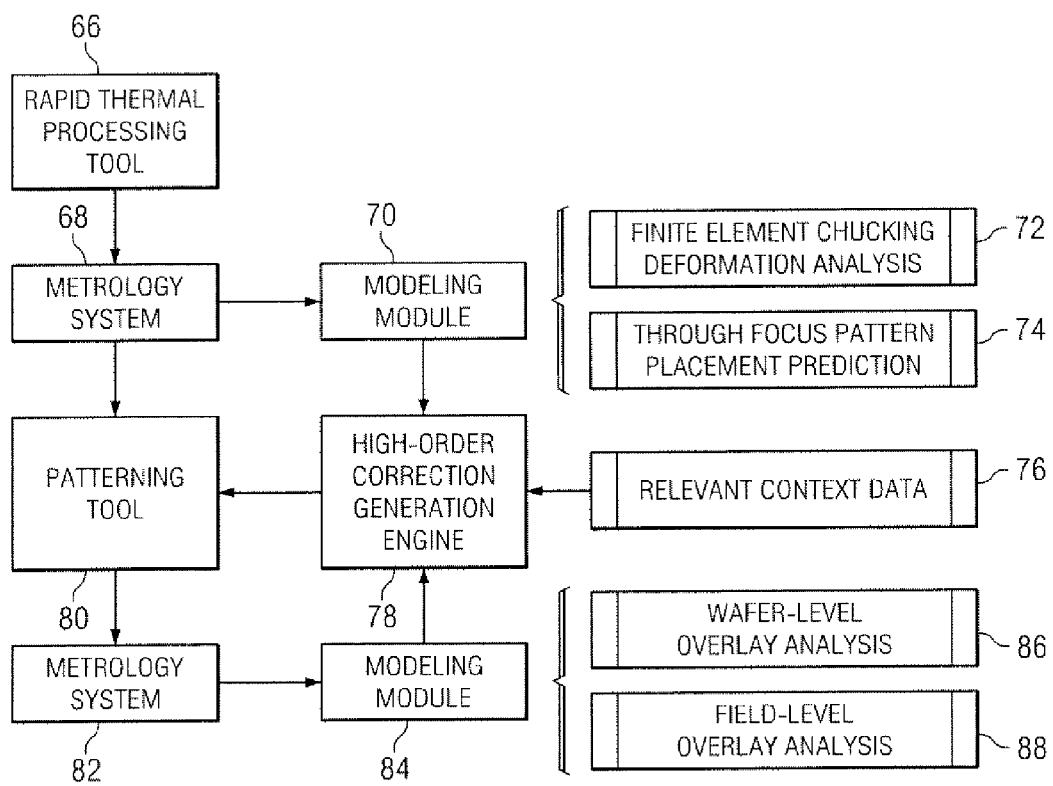
FIGS. 6-7 are flow charts illustrating various method embodiments.

Exemplary embodiments of the patterning method and a system operable to pattern a wafer are shown in FIG. 6. The system includes a measurement tool operable to perform measurements on the wafer. For example, the system may include metrology system 68 shown in FIG. 6. The method may include transferring wafers from a processing tool that may induce stress or deformation in the wafers to the metrology system. For example, wafers may be transferred from rapid thermal processing tool 66 to metrology system 68 shown in FIG. 6. Rapid thermal processing tool 66 may include any suitable processing tool known in the art. Metrology system 68 is operable to perform stress measurements, shape measurements, topography measurements, or some combination thereof on the wafers and may include any suitable metrology system known in the art. The metrology system may be further configured as described herein, and the measurements performed by metrology system 68 may include any of the measurement described herein. The method further includes feeding the metrology results into a forward control loop as described further herein.

The system also includes one or more processors operable to model deformation of the wafer based on results of the measurements and to alter one or more parameters of a patterning process based on the deformation of the wafer. The one or more processors may include modeling module 70 and high-order correction generation engine 78 shown in FIG. 6. The metrology data produced by the measurement tool is used as input for modeling module 70. Modeling module 70 may perform finite element chucking deformation analysis 72 to determine the predicted shape deformation (in 3 dimensions) that the wafer will have when the wafer is placed on the stage of the patterning tool. Modeling module 70 may also perform through focus pattern placement prediction 74, which may include a simulation of the impact of wafer deformation on the placement of the pattern generated on the wafer during the next patterning step. In one embodiment the simulation is based on known characteristics of the patterning process such as lithography system field dependent non-telecentric imaging (i.e., information about the non-telecentric imaging of the lithography system as a function of field on the wafer).

Using the modeling data from modeling module 70 and relevant context data 76 as inputs, a correction generation engine (e.g., high-order correction generation engine 78) computes and outputs high-order wafer- and field-level corrections. Examples of relevant context data 76 include IDs for the lot, wafer, layer, tool, and chamber, which may be acquired in real-time. Inputs for the correction generation engine may also include overlay, dose, or focus data, feed back from previous lots, or some combination thereof.

The system also includes patterning tool 80 operable to pattern the wafer using the patterning process after the one or more parameters of the patterning process have been altered to produce a first patterned wafer. For example, the wafer may be transferred from metrology system 68 to patterning tool 80 in any suitable manner. The wafer is then patterned by patterning tool 80 after high-order wafer- and field-level corrections have been made to both overlay and focus patterning system controls (not shown) of the patterning tool. After the patterning step, the wafer may be transferred from patterning tool 80 to metrology system 82. Metrology system 82 may perform overlay metrology, focus metrology, dose metrology, or some combination thereof on the wafer, which can be used for feedback control of the patterning process for the next wafer or lot. Results of overlay, dose, and focus metrology may be provided to modeling module 84, which is configured to perform wafer-level overlay analysis 86 and field-level overlay analysis 88. The results of these analyses are provided to the correction generation engine such that the correction generation engine can use the results to generate the corrections for the next wafer.

The embodiments described herein can be used to measure wafer stress and/or topography at critical process steps with more detail (spatial resolution) than is current practice. Those more detailed measurements are combined with models of how those stresses or shape changes interact with the exposure system wafer chuck in order to feed high-order correctibles to the exposure system such that the exposure system can make real-time adjustments during scanning in order to produce better registration between the printed pattern and prior patterns on the wafer. No such model or feedforward scheme is in use in the industry today.

Any currently used techniques for measuring wafer stress or wafer shape may be used in the embodiments described herein as long as the techniques are adapted to provide sufficiently high spatial resolution (e.g., such that the measurements can be used to adequately correct the patterning process such that the design pattern can be printed in the correct or substantially correct positions across the entire wafer). In some embodiments, the method includes performing measurements at all measurement spots on the wafer. However, the method may not include performing measurements at all measurement spots on the wafer. For example, measuring only about 80% of the measurement spots may produce sufficient data for altering the one or more parameters of the process such that the design pattern can be printed in the substantially correct positions on the wafer. Resolutions at which the measurements can be performed to provide sufficient data for modeling the deformation and altering one or more parameters of the patterning tool based on the deformation may be determined based on information about the deformation of other wafers processed in the same process and the same type of process tool (e.g., by examining one or more characteristics of the variation in deformation across wafers that have been similarly processed). Any technique known in the art for measuring overlay error may be used in the embodiments described herein. CD measurements may be used in conjunction with the overlay measurements in order to measure how much the focus has changed to provide focus metrology data.

The correction(s) may be generated using a theoretical model based on how the wafer stress and/or shape interact with the chuck. The model may also be based on empirical correlations between measurements of overlay, stress, shape, or any combination thereof. The model may be created once for a specific exposure system, or the method may constantly and automatically update the model as post-patterning overlay measurement results are accumulated. For example, once the model has been created for a specific exposure system, it may require no adjustments or it may be constantly and automatically updated as post-patterning overlay measurement results are acquired. Separate models may be used for each exposure system (because each exposure system has its own unique optics aberrations) and/or illumination mode (because each illumination mode interacts with the optics aberrations to produce unique signatures of non-telecentricity).

The embodiments described herein may involve measuring all wafers for stress and/or shape after a critical processing step and for overlay errors after patterning. Alternatively, the method may involve measuring only subsets of the wafers for one or both metrology steps. If a single process tool (or single process chamber on a specific tool) has a repeatable signature of wafer deformation, it may be sufficient to measure one wafer per lot from that tool (or chamber) or one wafer per several lots for one or both metrology steps.

Figure 7:
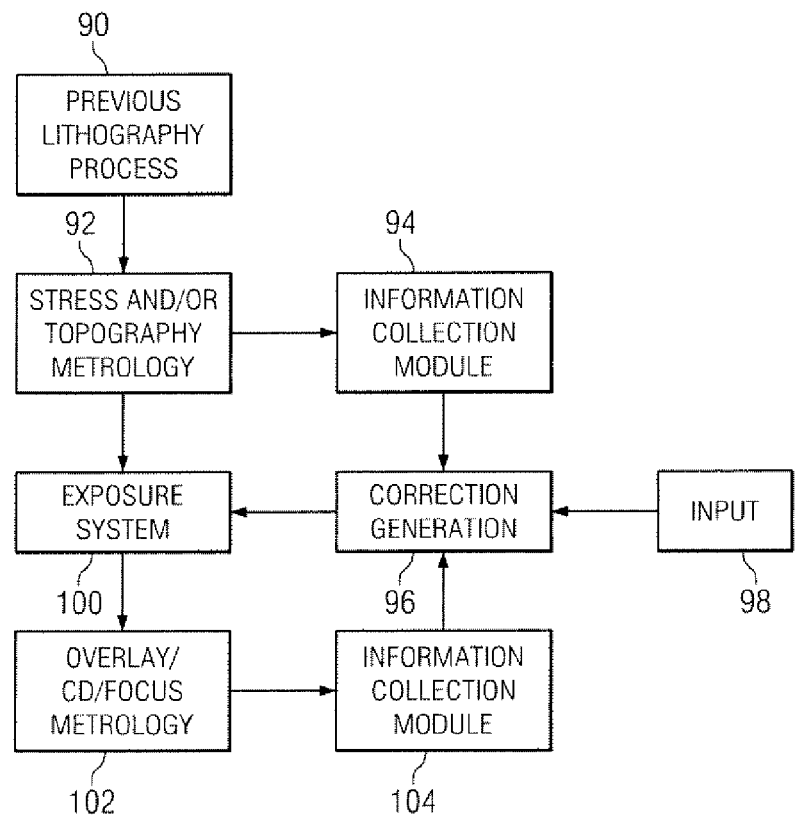

Another embodiment of the correction method is shown in FIG. 7. This method includes previous lithography process 90, which may include any suitable lithography process known in the art. The method may include transferring wafers on which the previous lithography process was performed to a measurement system (not shown in FIG. 7). The method also includes stress and/or topography metrology 92 that may be performed on the wafers as described herein. Results of stress and/or topography metrology may be fed forward to information collection module 94, which may include any suitable hardware and/or software known in the art.

The collected information may be provided via a feedforward loop to correction generation 96, which may be performed as described herein. Correction generation may include generating scanner correctables (e.g., how one or more parameters of the patterning tool or scanner should be altered). Input 98 to correction generation 96 may include context key, which may include lot ID, wafer ID, layer ID, tool ID, reference tool ID, chamber ID, reticle ID, pre-tool ID, etc. The corrections that are generated by correction generation 96 may be provided to exposure system 100 by a feedforward and/or feedback loop. The wafers may be transferred from the measurement system that performed the stress and/or topography metrology to exposure system 100. Exposure system 100 may perform a lithography process on the wafers. Overlay/CD/focus metrology 102 may then be performed on the wafers as described further herein. The results of the overlay/CD/focus metrology 102 may be provided via a feedback loop to information collection module 104, which may include any suitable hardware and/or software known in the art.

The correction generation may be performed in various ways. For example, feedforward information can be used to generate high-order grid correction, individual field-level correction (linear and high-order), focus correction, or some combination thereof. In another example, feedforward information may include wafer shape-related overlay error, normally process-related like thermal process, etch process, CMP process, etc. In an additional example, feedback information can be used to generate high-order grid correction, average of fields correction (linear and high-order), individual field-level correction (linear and high-order), or some combination thereof. In a further example, feedback information may include exposure system signature (stage, scanning, reticle stage, lens signature, illumination signature), reticle signature, exposure system matching signature, remaining process-related signature, or some combination thereof. The method shown in FIG. 7 may include any other step(s) of any other method(s) described herein.

The embodiments described herein have a number of advantages. For example, lithography exposure systems (e.g., scanners) are substantially expensive (e.g., about $30 million for a 193 nm immersion scanner). Since the embodiments described herein can be used to improve the efficiency of exposure systems, the embodiments described herein may be of relatively high value to users of exposure systems. In particular, as described further herein, high-order corrections can be used for feedforward control. In addition, since the stress/shape measurement is performed before the lithography (patterning) process, the embodiments described herein can include both high-order correction and field-level correction. Furthermore, intensive metrology can be used to generate the corrections for each wafer, which can be provided by the embodiments described herein in a timely and cost efficient manner. Moreover, the embodiments described herein can be used to connect metrology tools more efficiently with software for generating and tracking these corrections thereby enabling more efficient use of the metrology tools and more efficient control of the processes.

The embodiments described herein may have a variety of functionality including, but not limited to, sampling optimizer, AL/OL data analysis, flexible overlay sampling based on AL/OL data, and flexible overlay sampling based on other pre-lithography tool data. For example, the embodiments described herein may have functionality that includes alignment data analysis capability to detect overlay excursions (or receive relative information from a host). Alignment data generally means raw data, modeled parameters (can be a couple of model simultaneously), and un-modeled data, which is called as residual. In addition, the functionality of the embodiments described herein may include dynamic (flexible) sampling by scrip which can be defined by a user. The sampling optimizer may include an automated method for overlay sample plan optimization based on spatial variation modeling.

AL data analysis to detect overlay excursion may use a first input (AL residual) for detection of wafer deformation like warpage and/or bow. The source file may include, for example, an awe file, an EGAM file, or any other suitable standard file known in the art. The action performed may include increasing the number of fields to detect a signature of deformation. An advanced application includes a couple of different modeling and proper correction for relatively high residual wafer (SMM function). For example, the different modeling and proper correction may include linear, vortex (dipole), sombrero (expansion by radius), third polynomial: this can be the trigger to change the alignment model, which may not be practical in production mode, but may be practical for research and development or troubleshooting purposes. So troubleshooting analysis may be finished by dynamic sampling automatically. A user (e.g., an engineer) may just make a decision. And once the user has some experience with a specific signature, direct feedback for a relevant process is also possible like a sombrero signature with a deposition chamber issue. A second input may include range of wafer expansion and orthogonality and high-order terms for detection of wafer-to-wafer variation. The source file may include a lot_report file, EGAM (EGAM, SIG, SOL input for OLEV), or any other suitable standard file known in the art. An action may include increasing the number of wafers. An advanced application may include showing the trend of correctable parameters for both alignment and overlay data. This may be performed to determine the reason for failure such as chuck-to-chuck variation, correctable drift, lens heating, etc., and/or root of failure such as alignment induced or not. The AL data analysis may include the lot ID for certain systems (such as the Archer systems that are commercially available from KLA-Tencor), and a combination (AL residual and range) may be available.

Flexible sampling may include OVL excursion detection by AL data. OVL excursion detection may include using an OL residual threshold to detect wafers for which the AL residual value is above a threshold, and sampling by this may be defined by a user in advance. OVL excursion detection may also or alternatively use a wafer-to-wafer variation threshold to detect wafers for which a correctable value (of AVG-threshold) is above the threshold and/or to detect wafers for which "n" sigma of correctable is above the tolerance.

Flexible sampling may also include OVL excursion detection by OL data. For example, an OL residual threshold may be used to detect wafers for which OL residual value is above a threshold. Sampling by this may be defined by a user in advance to increase sampling field and/or to increase sampling wafers. OVL excursion detection by OL data may also or alternatively use a wafer-to-wafer variation threshold to detect wafers for which a correctable value (of AVG-threshold) is above the threshold or to detect wafers for which "n" sigma of correctable is above the tolerance, which may include increasing the sampling field and/or increasing the sampling wafers. In addition, all detection functions may be switchable (enable/disable).

Figure 8:
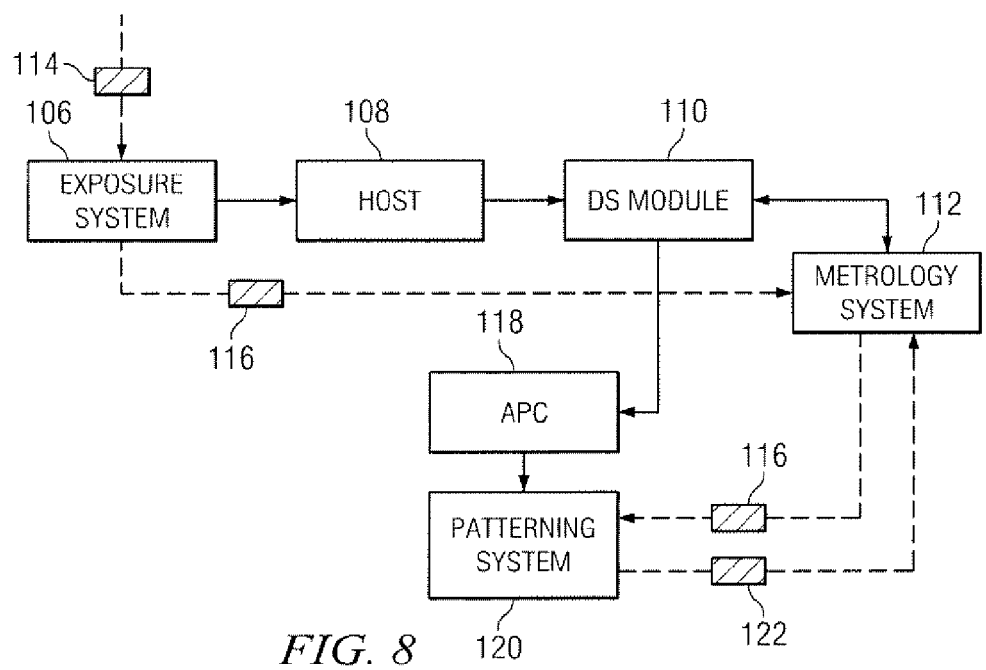
FIG. 8 is a block diagram illustrating one embodiment of a system operable to pattern a wafer.

FIG. 8 illustrates an embodiment of a dynamic sampling and correction system operable to perform one or more methods described herein. The system includes exposure system 106, which may be any suitable exposure system known in the art that is operable to expose wafer 114 to a pattern of light. Examples of a suitable exposure system include a stepper and a scanner. Exposure system 106 is operable to generate information such as alignment (AL) data, lot ID, chuck ID, and reticle ID, and to send such information to host 108. Host 108 may include one or more processors (not shown) operable to provide the AL data, lot ID, chuck ID, and reticle ID to dynamic sampling (DS) module 110. DS module 110 may include one or more storage media (not shown) for receiving and storing the AL data, lot ID, chuck ID, and reticle ID received from host 108. DS module 110 may also include one or more processors (not shown) operable to trigger a sampling scheme or plan (i.e., a specific recipe) and provide the triggered sampling scheme to metrology system 112. The metrology system may include a commercially available metrology system such as the Archer 10 system, which is commercially available from KLA-Tencor. Exposed wafer 116 may be transferred from exposure system 106 to metrology system 112 for measurements in a container (not shown), which may be any suitable container known in the art such as a cassette or a pod. Metrology system 112 is configured to perform measurements on exposed wafer 116 using the sampling scheme provided by DS module 110. The measurements performed on exposed wafer 116 may include any of the measurements described herein. For example, in one embodiment, metrology system 112 may perform stress and topography measurements. In another embodiment, overlay (OL), dose, or focus measurements may be performed. For example, metrology system 112 may be configured to measure overlay of one or more of the wafers and may use the sampling plan from DS module 110 to perform the overlay measurements. Metrology system 112 is configured to provide the metrology data (e.g., overlay results) to DS module 110, which may adjust the sampling scheme for other wafers in the same or next lot in accordance with the methods described herein. For example, DS module 110 may generate an additional sampling plan (specific recipe) that may optionally depend on user definition.

DS module 110 may be configured to feed the metrology data in a forward control loop to advanced process control (APC) system 118. In this manner, DS module 110 may be configured to update APC system 118. APC system 118 is operable to control patterning system 120 to compensate for the deformation of exposed wafer 116. APC system 118 may have any suitable configuration known in the art. In one embodiment, APC system 118 is configured to perform modeling using the metrology data forwarded from DS module 110. For example, APC system 118 may be operable to perform a finite element chucking deformation analysis based on the metrology data or make through-focus pattern placement predictions as described above. In another embodiment, APC system 118 is operable to generate corrections as described above. Based on the results of modeling, APC system 118 updates the overlay and focus patterning controls (not shown) of patterning system 120 with high-order wafer- and field-level corrections. The controls of patterning system 120 are operable to implement the corrections to the patterning system. The controls of patterning system 120 may be any suitable controls known in the art. Exposed wafer 116 is transferred from metrology system 112 to patterning system 120, where the corrections generated by APC system 118 are implemented and exposed wafer 116 is patterned. As a result, exposed wafer 116 becomes patterned wafer 122.

In one embodiment. APC system 118 is configured to generate corrections partly or wholly based on metrology data of patterned wafer 122. For example, after patterning, patterned wafer 122 may be sent back to metrology system 112 to be measured again. DS module 110 may be configured to provide an additional sampling plan (e.g., a specific recipe), which may optionally vary depending on a user definition. Metrology system 112 may be configured to obtain the OL, dose, and focus data of patterned wafer 122 and provide these data in a feedback loop to DS module 110 and APC system 118 for further modeling. The modeling of the metrology data of patterned wafer 122 may thus be used in generating corrections for the patterning of another wafer in the same or next lots.

The embodiments disclosed herein may be modified to satisfy various external process needs. For example, the information flow described above may be routed directly from exposure system 106 to metrology system 112 instead of being routed through host 108. As another example, in some processes, it may be more desirable or efficient for patterned wafer 122 to be measured by a second metrology system (not shown) instead of the same metrology system 112. In yet another example, patterning system 120 may be another exposure system similar to exposure system 106. In this manner, the embodiments described herein may be used with multiple exposure systems (e.g., scanners).

The system described above may be adapted to various workflows. In one example, the alignment data (e.g., alignment residual in the x direction and alignment residual in the y direction) may show that a particular wafer (e.g., wafer #05) in a lot of wafers is out of a wafer-to-wafer tolerance setting in the dynamic sampling script. The wafer-to-wafer tolerance may be defined as: if the range is over a threshold setting, some wafers will be selected by 1) average minus the tolerance setting; and/or 2) choose +/−10% of distribution (for some sigma setting). Standard measurements may be performed on a number of wafers in the lot (e.g., wafers #02, 03, 21, and 22). For example, the standard measurements may be performed using a standard sampling category, a standard sampling model, and standard analysis. An additional measurement (standard sampling or a wafer-to-wafer sampling category) and spec out may be performed on wafer #05. If the overlay data is outside of the specification, wafer #05 may be reworked. If the overlay data is inside the specifications, no action may be taken. The work flow may include sending only wafer #05 to rework. The APC system may determine the ideal correction for wafer #05, and wafer #05 may be exposed with the ideal correction. Only wafers #02, 03, 21, and 22 are used for APC feedback. If necessary, A.A generates two results files. The benefits of the above-described work flow include automatic overlay problem detection, avoidance of the risk of yield loss, saving engineer time, and no APC impact.

In another example, the work flow described above may be used together with SMM. For example, the alignment data (e.g., alignment residual in the x direction and alignment residual in the y direction) may show that wafer #25 is out of an alignment residual tolerance setting in DS script. Or, overlay data of specific wafer is out of spec is the same case. Standard measurements may be performed on a number of the wafers (e.g., wafers #02, 03, 21, 22). The standard measurements may be performed using a standard sampling category, a standard sampling model, and standard analysis. Additional measurements (increased sampling) may be performed on wafer #25 using an AL residual sampling category. For example, the measurements may be performed for each field on the wafer. Wafer #25 may show a residual that is too high. Therefore, the wafer does not meet the overlay specification. SMM may simulate the overlay data of wafer #25 and show possible improvement by ideal grid-correction per field. The APC may simulate the overlay data and recommend a new model that can reduce residual value. This information can be a trigger to use a different alignment model. However, changing the alignment model may not be considered for trouble shooting because it requires a new recipe at the scanner. SMM may generate the necessary information. A scanner acceptable format may be important like gcmr files and sub-recipe and sees message. Only wafers #02, 03, 21, and 22 are used for APC feedback. The above-described work flow has a number of benefits including automatic overlay problem detection, avoidance of the wafer scrap or yield loss, saving engineer time, no APC impact, and proper process correction even for different model parameters like high-order model.

A number of options may be used to control the APC impact. For example, to avoid the damage for APC control, one option includes generating two analysis files whenever additional sampling has been used. Analysis based on standard sampling will be used to update APC. This method is advantageous in that there is no change for APC. However, there may be additional analysis for AA. Another option for avoiding the damage for APC control includes not using any lot for APC which used additional sampling. In this manner, there is no additional analysis for AA. However, additional sampling may be added to APC lot context.

The embodiments described herein have a number of advantages. For example, the embodiments may include monitoring all wafers for excursions, which can minimize the risk of yield loss. In this manner, not even a single wafer can bypass the overlay monitoring. In addition, the embodiments described herein may include automatic troubleshooting start. The embodiments described herein may also be used for flexible sampling by user definition thereby improving sampling efficiency. For example, the embodiments described herein may be used for automatic sampling selection by user-definition. In addition, the sampling efficiency may be improved with minimum overlay measurement increase.

The embodiments described herein also have no impact on APC. In addition, the embodiments described herein are advantageous for engineering since a substantial amount of engineer time will be saved by proper additional sampling. Furthermore, the embodiments described herein are advantageous in terms of cycle time. For example, when proper overlay measurement sampling is being implemented, the necessary information for proper correction is generated thereby improving cycle time.

The embodiments described herein may be used for dynamic overlay sampling using alignment data. The embodiments described herein may be used to make overlay sampling more efficient and proper by using alignment data from an exposure system. Alignment data for a specific lot may be used to adjust overlay measurement sampling of the same lot.

Currently, overlay sampling is being determined by user-predefined sampling. However, because of the limited throughput of overlay metrology systems, overlay sampling has been performed randomly which means that if a problematic (excursion) wafer is not measured for overlay, the method cannot detect the overlay problem and the wafer (lot) will just pass to the next process simply because it is not detected.

However, since, in the embodiments described herein, alignment may be performed for every single wafer, using alignment data as one trigger to determine overlay sampling can detect overlay excursions more efficiently and properly. In addition, since alignment is performed for every single wafer, using alignment data as one trigger to determine overlay sampling can reduce the risk of potential yield loss by overlay spec-out. Furthermore, there is no impact for APC even though there are additional measurements.

The embodiments described herein may be used in a number of different use cases. For example, one use case in which the embodiments described herein may be particularly useful is double patterning lithography. In one such example, if non-direct alignment is used in double patterning (i.e., the second layer is aligned to the same layer as the first layer), residuals of the first layer may be used as described further herein in order to determine the sample size of the second layer. In another example, if non-direct alignment is used in double patterning (i.e., the second layer is aligned to the same layer as the first layer), the spec of the second layer may be updated in accordance with results described herein such as in accordance with overlay results of the first layer. In an additional example, if non-direct alignment is used, a model of the first layer may be used as a prediction model for the second layer. Then, the minimum required sampling may be measured on the second layer, and the result may be compared with a predetermined model. If differences are above the threshold, additional measurements may be performed. In a further example, if only two targets are measured (e.g., layer 1/layer 0 and layer 2/layer 0) and results of the third target are predicted (e.g., layer 2/layer 1), and if the prediction is out of spec, the full sampling measurement of these targets may be performed.

Each of the embodiments of each of the methods described above may include any other step(s) of any other method(s) described herein. Furthermore, each of the embodiments of each of the methods described above may be performed by any of the systems described herein.

Further modifications and alternative embodiments of various aspects of the invention may be apparent to those skilled in the art in view of this description. For example, methods and systems for creating or performing a dynamic sampling scheme for a process during which measurements are performed on wafers are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for creating a dynamic sampling scheme for a process during which measurements are performed on wafers, comprising:
    performing the measurements on all of the wafers in at least one lot at all measurement spots on the wafers; and
    determining an optimal sampling scheme, an enhanced sampling scheme, a reduced sampling scheme, and thresholds for the dynamic sampling scheme for the process based on results of the measurements, wherein the thresholds correspond to values of the measurements at which the optimal sampling scheme, the enhanced sampling scheme, and the reduced sampling scheme are to be used for the process, wherein the optimal sampling scheme, the enhanced sampling scheme, and the reduced sampling scheme comprise numbers of other wafers in other lots to be measured in the process by a measurement tool and one or more parameters of the measurements to be performed on each of the other wafers by the measurement tool during the process, wherein the one or more parameters of the measurements for at least two of the optimal sampling scheme, the enhanced sampling scheme, and the reduced sampling scheme are different and determined prior to use of the dynamic sampling scheme, and wherein said determining is performed using a computer system.

2. The method of claim 1, wherein said all measurement spots comprise all fields on the wafers, all targets on the wafers, or said all fields and said all targets on the wafers.

3. The method of claim 1, further comprising performing the method at predetermined intervals.

4. The method of claim 1, wherein the results of the measurements comprise information about variation in the measurements.

5. The method of claim 1, wherein the optimal sampling scheme, the enhanced sampling scheme, and the reduced sampling scheme are determined based on the results of the measurements in combination with information from one or more tools that performed one or more other processes on the wafers.

6. The method of claim 1, further comprising performing the dynamic sampling scheme by performing the measurements on the other wafers in the other lots during the process, comparing values of the measurements performed on the other wafers to the thresholds, and determining which of the sampling schemes is to be used for the process during which the measurements are performed on additional wafers in additional lots based on results of said comparing.

7. The method of claim 6, further comprising altering the one or more parameters of the measurement tool configured to perform the process prior to performing the measurements on the additional wafers.

8. The method of claim 1, wherein the process comprises a metrology process.

9. The method of claim 1, wherein the results of the measurements comprise raw measurement data, and wherein the method further comprises applying an absolute value or regression filter to the raw measurement data before said determining based on the raw measurement data.

10. The method of claim 1, wherein said determining comprises determining the optimal sampling scheme, the enhanced sampling scheme, the reduced sampling scheme, and the thresholds based on the results of the measurements and based on historical process control data for one or more processes performed on said all wafers.

11. The method of claim 1, wherein said determining comprises determining the optimal sampling scheme, the enhanced sampling scheme, the reduced sampling scheme, and the thresholds based on the results of the measurements and based on an optimization criterion and one or more constraints external to the measurement process.

12. The method of claim 1, wherein the thresholds comprise direct thresholds.

13. The method of claim 1, wherein the thresholds comprise direct thresholds, and wherein the method further comprises performing the dynamic sampling scheme by comparing results of the measurements performed on the other wafers in the other lots to the direct thresholds.

14. The method of claim 1, wherein the thresholds comprise direct thresholds, and wherein the method further comprises performing the dynamic sampling scheme by comparing statistical properties of results of the measurements performed on the other wafers in the other lots to the direct thresholds.

15. The method of claim 1, wherein the thresholds comprise direct thresholds, and wherein the method further comprises performing the dynamic sampling scheme by comparing historical process control data to the direct thresholds.

16. The method of claim 1, wherein the thresholds comprise direct thresholds, and wherein the method further comprises performing the dynamic sampling scheme by comparing data from one or more metrology tools or one or more process tools to the direct thresholds.

17. The method of claim 1, wherein the thresholds comprise non-direct thresholds.

18. The method of claim 1, wherein the thresholds comprise non-direct thresholds, and wherein the method further comprises performing the dynamic sampling scheme by comparing time data to the non-direct thresholds.

19. The method of claim 1, wherein the thresholds comprise non-direct thresholds, and wherein the method further comprises performing the dynamic sampling scheme by comparing process tool quality control data to the non-direct thresholds.

20. The method of claim 1, wherein the thresholds comprise non-direct thresholds, and wherein the method further comprises performing the dynamic sampling scheme by comparing production floor or material planning data to the non-direct thresholds.

21. A method for dynamically selecting a sampling scheme for a process during which measurements are performed on wafers, comprising:
    performing the measurements on at least one wafer in at least one lot using an optimal sampling scheme;
    comparing values of the measurements to thresholds that correspond to the values of the measurements at which an enhanced sampling scheme or a reduced sampling scheme is to be used for the process instead of the optimal sampling scheme, wherein the optimal sampling scheme, the enhanced sampling scheme, and the reduced sampling scheme comprise numbers of other wafers in other lots to be measured in the process by a measurement tool and one or more parameters of the measurements to be performed on each of the other wafers by the measurement tool during the process, and wherein the one or more parameters of the measurements for at least two of the optimal sampling scheme, the enhanced sampling scheme, and the reduced sampling scheme are different and determined prior to performance of the method; and
    selecting the optimal sampling scheme, the enhanced sampling scheme, or the reduced sampling scheme for the process during which the measurements are to be performed on the other wafers in the other lots based on results of said comparing.

22. The method of claim 21, further comprising altering the one or more parameters of the measurement tool configured to perform the process prior to performing the measurements on the other wafers.

23. A system configured to create a dynamic sampling scheme for a process during which measurements are performed on wafers, comprising:
    a measurement tool configured to perform the measurements on the wafers; and
    one or more processors configured to:
        control the measurement tool to perform the measurements on all of the wafers in at least one lot at all measurement spots on the wafers; and
        determine an optimal sampling scheme, an enhanced sampling scheme, a reduced sampling scheme, and thresholds for the dynamic sampling scheme for the process based on results of the measurements, wherein the thresholds correspond to values of the measurements at which the optimal sampling scheme, the enhanced sampling scheme, and the reduced sampling scheme are to be used for the process, and wherein the optimal sampling scheme, the enhanced sampling scheme, and the reduced sampling scheme comprise numbers of other wafers in other lots to be measured in the process by the measurement tool and one or more parameters of the measurements to be performed on each of the other wafers by the measurement tool during the process, and wherein the one or more parameters of the measurements for at least two of the optimal sampling scheme, the enhanced sampling scheme, and the reduced sampling scheme are different and determined prior to use of the dynamic sampling scheme.

24. The system of claim 23, wherein said all measurement spots comprise all fields on the wafers, all targets on the wafers, or said all fields and said all targets on the wafers.

25. The system of claim 23, wherein the system is further configured to create the dynamic sampling scheme at predetermined intervals.

26. The system of claim 23, wherein the results of the measurements comprise information about variation in the measurements.

27. The system of claim 23, wherein the one or more processors are further configured to determine the optimal sampling scheme, the enhanced sampling scheme, and the reduced sampling scheme based on the results of the measurements in combination with information from one or more tools that performed one or more other processes on the wafers.

28. The system of claim 23, wherein the one or more processors are further configured to perform the dynamic sampling scheme by comparing values of the measurements performed on the other wafers in the other lots to the thresholds and determining which of the sampling schemes is to be used for the process during which the measurements are performed on additional wafers in additional lots based on results of said comparing.

29. The system of claim 28, wherein the one or more processors are further configured to alter the one or more parameters of the measurement tool before the measurement tool performs the process on the additional wafers.

30. The system of claim 23, wherein the measurement tool is further configured as a metrology tool.

* * * * *